US012671411B2

(12) United States Patent
Mishima

(10) Patent No.: US 12,671,411 B2
(45) Date of Patent: Jun. 30, 2026

(54) SIGNAL TRANSMISSION DEVICE, ELECTRONIC DEVICE INCORPORATING THE SIGNAL TRANSMISSION DEVICE, AND VEHICLE INCORPORATING THE ELECTRONIC DEVICE

(71) Applicant: ROHM CO., LTD., Kyoto (JP)

(72) Inventor: Koki Mishima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 19/079,722

(22) Filed: Mar. 14, 2025

(65) Prior Publication Data

US 2025/0293684 A1 Sep. 18, 2025

(30) Foreign Application Priority Data

Mar. 15, 2024 (JP) ................................ 2024-041010

(51) Int. Cl.
*H03K 17/56* (2006.01)
*B60R 16/023* (2006.01)
*H02P 23/00* (2016.01)

(52) U.S. Cl.
CPC ........... *H03K 17/56* (2013.01); *B60R 16/023* (2013.01); *H02P 23/00* (2013.01)

(58) Field of Classification Search
CPC ........ H03K 17/56; B60R 16/023; H02P 23/00
See application file for complete search history.

(56) References Cited

U.S. PATENT DOCUMENTS 10,020,801 B2 * 7/2018 Thalheim ............... H03K 17/61

FOREIGN PATENT DOCUMENTS

JP 2017188903 A 10/2017

* cited by examiner

*Primary Examiner* — Carlos Amaya
(74) *Attorney, Agent, or Firm* — Fish & Richardson P.C.

(57) ABSTRACT

A signal transmission device includes a transmission circuit, a reception circuit, and an isolation circuit. The transmission circuit is configured to drive at least one of a first internal signal and a second internal signal at a specific period according to an external signal. The reception circuit includes: a detection circuit configured to be able to detect that the period of at least one of the first internal signal and the second internal signal is the specific period; a first driving circuit configured to set the gate of a switching device to high impedance state according to the detection result of the detection circuit; and a second driving circuit configured to turn ON the switching device by inputting a specific voltage to the gate according to the detection result. The specific voltage has a voltage value higher than or equal to the ON threshold voltage of the switching device.

9 Claims, 18 Drawing Sheets

SIGNAL TRANSMISSION DEVICE, ELECTRONIC DEVICE INCORPORATING THE SIGNAL TRANSMISSION DEVICE, AND VEHICLE INCORPORATING THE ELECTRONIC DEVICE

INCORPORATION BY REFERENCE

This nonprovisional application claims priority under 35 U.S.C. § 119(a) on Patent Application No. 2024-041010 filed in Japan on Mar. 15, 2024, the entire contents of which are hereby incorporated by reference.

TECHNICAL FIELD

The present disclosure relates to a signal transmission device, an electronic device incorporating the signal transmission device, and a vehicle incorporating the electronic device.

BACKGROUND ART

Conventionally, signal transmission devices that transmit pulse signals while isolating between input and output have been used in various applications (such as power supply devices or motor driving devices).

Solution to Problem

According to one aspect of the present disclosure, a signal transmission device includes a transmission circuit, a reception circuit, and an isolation circuit. The transmission circuit is configured to output a first internal signal and a second internal signal which pulse-drive according to an input signal. The reception circuit is configured to output a drive control signal according to the first internal signal and the second internal signal. The isolation circuit is configured to transmit the first internal signal and second internal signal while isolating between the transmission circuit and reception circuit. The transmission circuit is configured to drive at least one of the first internal signal and the second internal signal at a specific period different from the period of the input signal according to an external signal different from the input signal. The reception circuit includes: a detection circuit configured to be able to detect that the period of at least one of the first internal signal and second internal signal is the specific period; a first driving circuit configured to drive a switching device with the drive control signal and to set a gate of the switching device to high impedance state according to the detection result of the detection circuit; and a second driving circuit configured to turn ON the switching device by inputting a specific voltage to the gate according to the detection result. The specific voltage has a voltage value higher than or equal to the ON threshold voltage of the switching device.

The electronic device disclosed in this specification includes a plurality of switching devices each being a power transistor, and a plurality of gate driver ICs each driving a gate of corresponding one of the plurality of switching devices. At least one of the plurality of gate driver ICs is the signal transmission device of the configuration described above.

The vehicle disclosed in this specification includes the electronic device of the configuration described above.

DESCRIPTION OF EMBODIMENTS

<Signal Transmission Device (Basic Configuration)>

Figure 1:
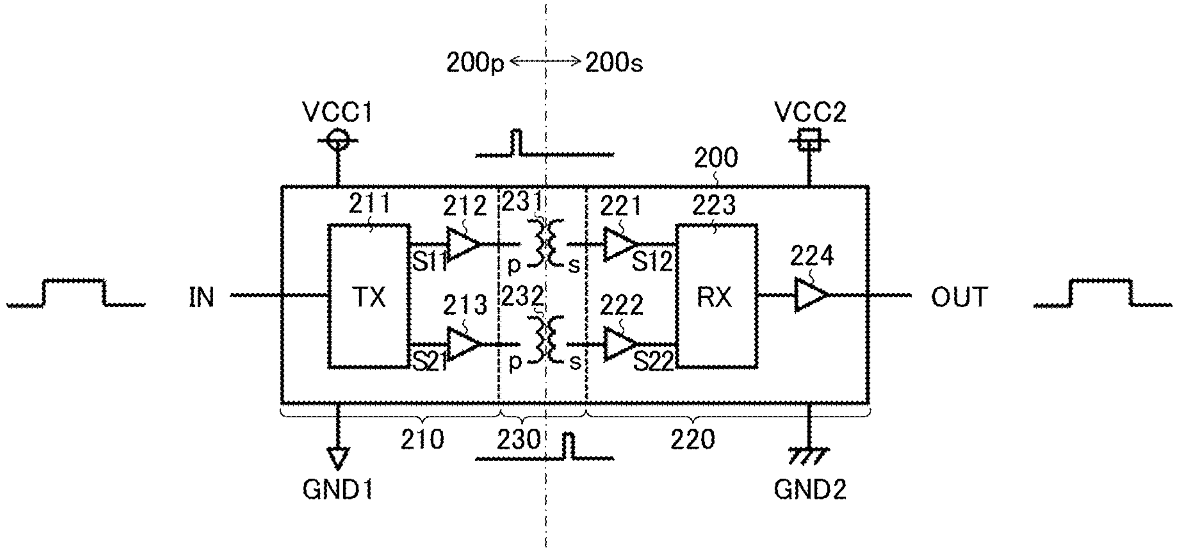
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200*p* (VCC1-GND1 system) and a secondary circuit system 200*s* (VCC2-GND2 system), transmits a pulse signal from the primary circuit system 200*p* to the secondary circuit system 200*s* to drive the gate of a switching device (unillustrated) provided in the secondary circuit system 200*s*. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
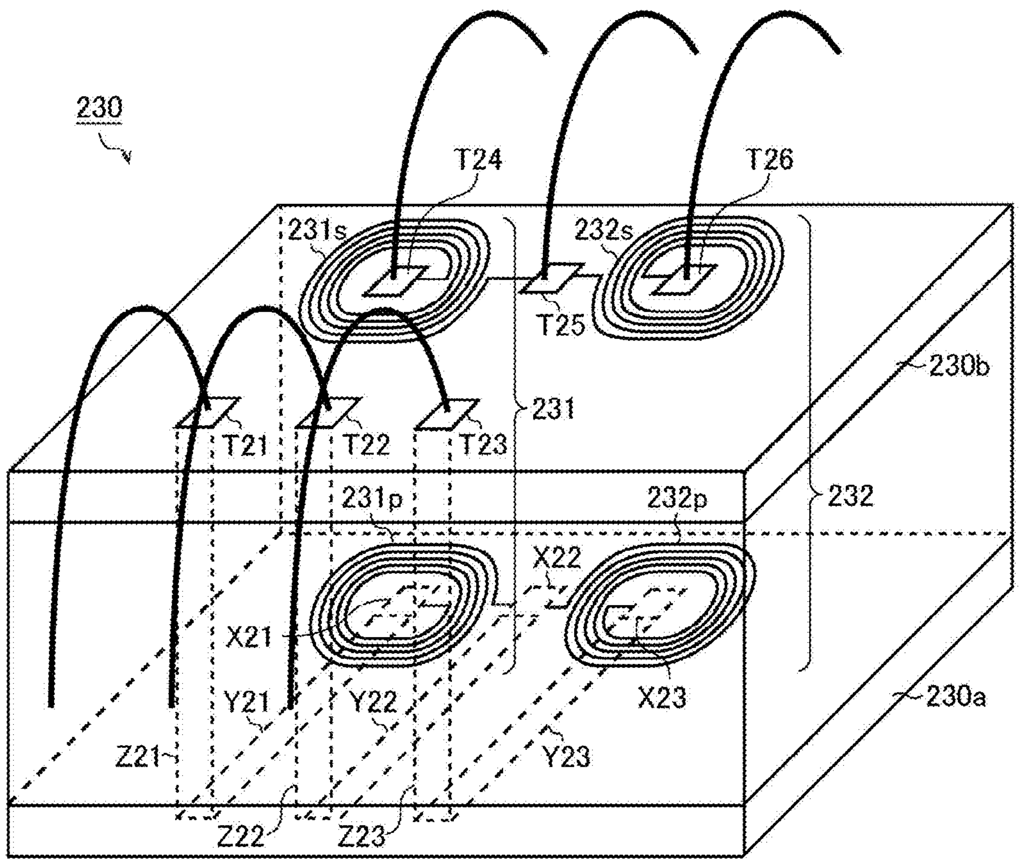
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232*s*, which is connected to the external terminal T26. The second terminal of the secondary coil 232*s*, which corresponds to its end point, is connected to the external terminal T25. The external terminals T24, T25, and T26 are disposed in a straight row in the illustrated order and are used for wire-bonding with the driver chip 220.

The secondary coils 231*s* and 232*s* are AC-connected to the primary coils 231*p* and 232*p*, respectively, by magnetic coupling, and are DC-isolated from the primary coils 231*p* and 232*p*. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
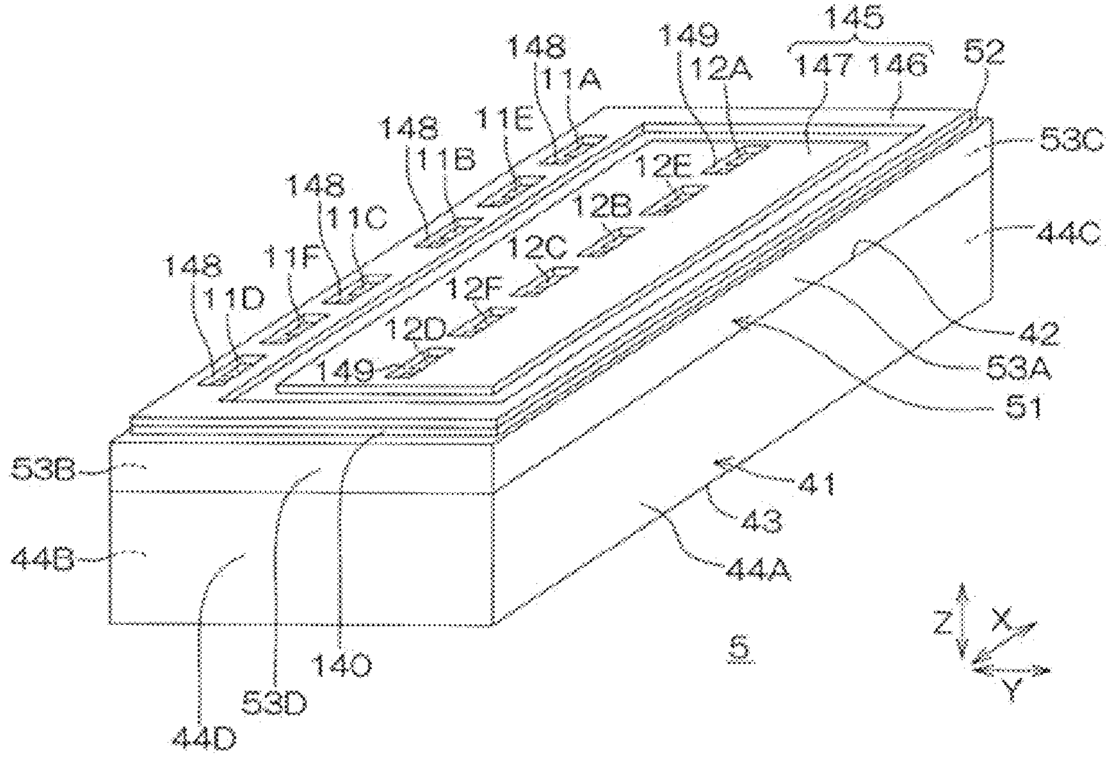
FIG. 3 a perspective view of a semiconductor device used as a two-channel transformer chip.
Figure 4:
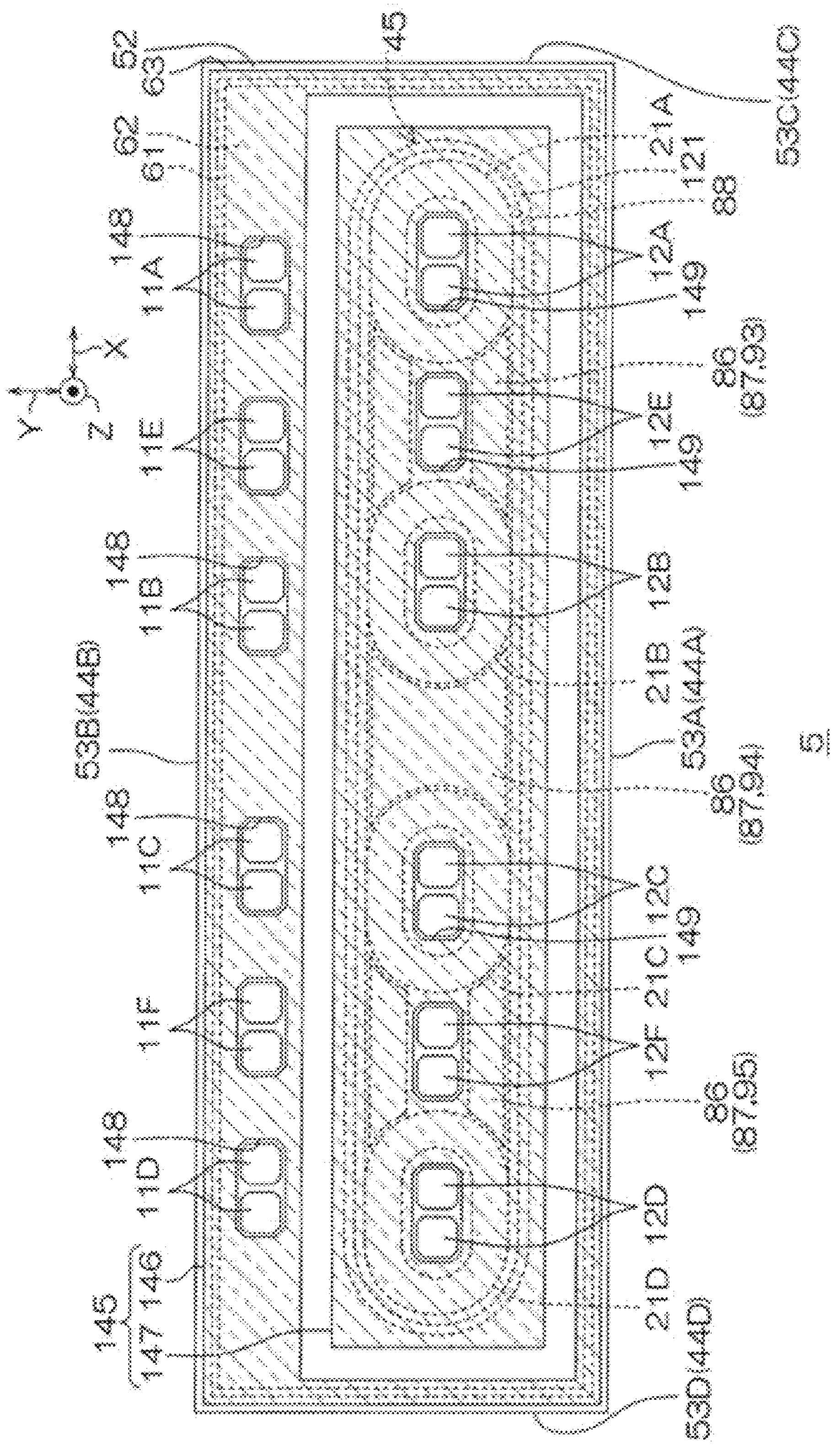
FIG. 4 is a plan view of the semiconductor device shown in FIG. 3.
Figure 5:
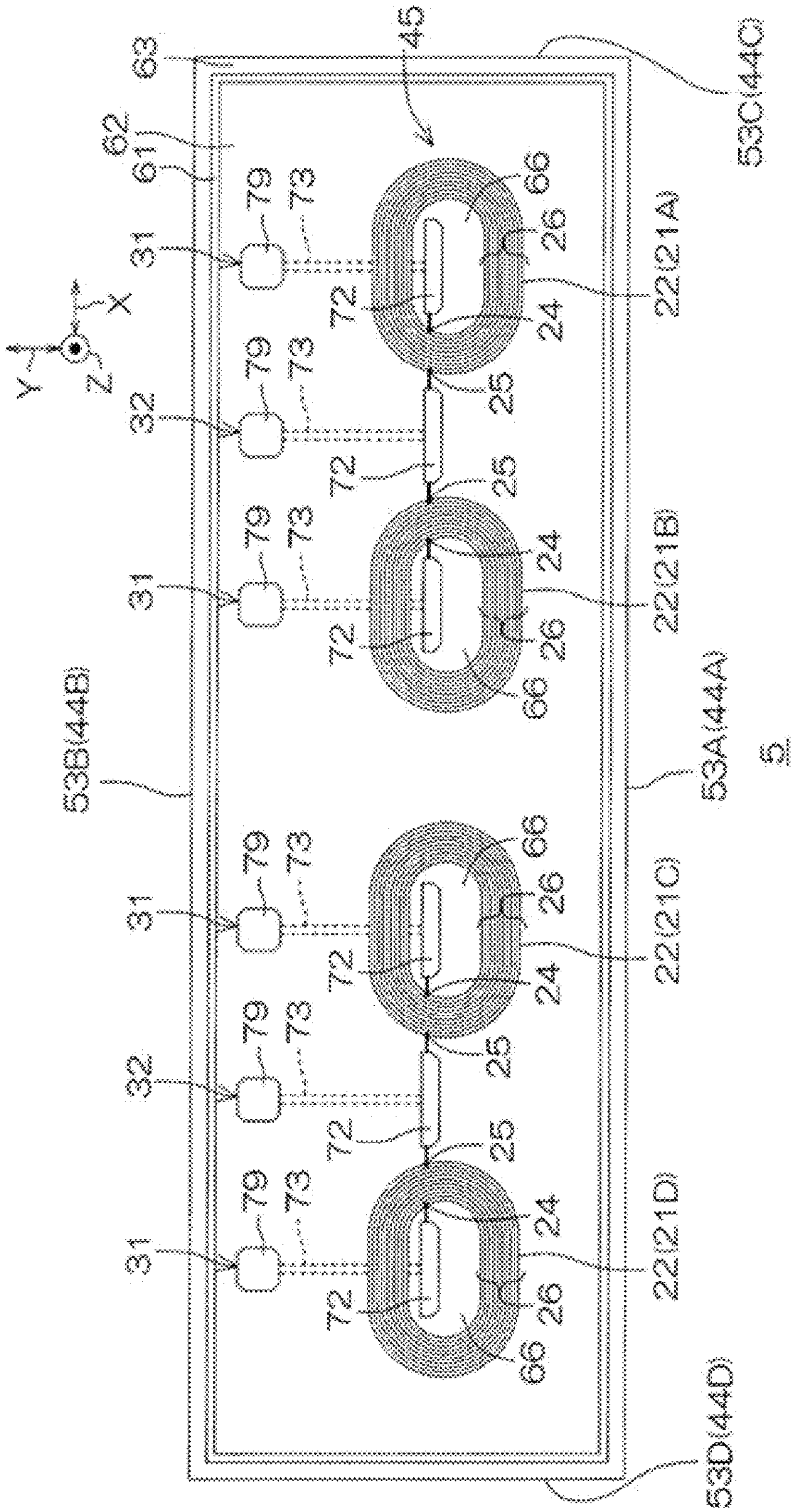
FIG. 5 is a plan view of a layer in the semiconductor device shown in FIG. 3 where low-potential coils are formed.
Figure 6:
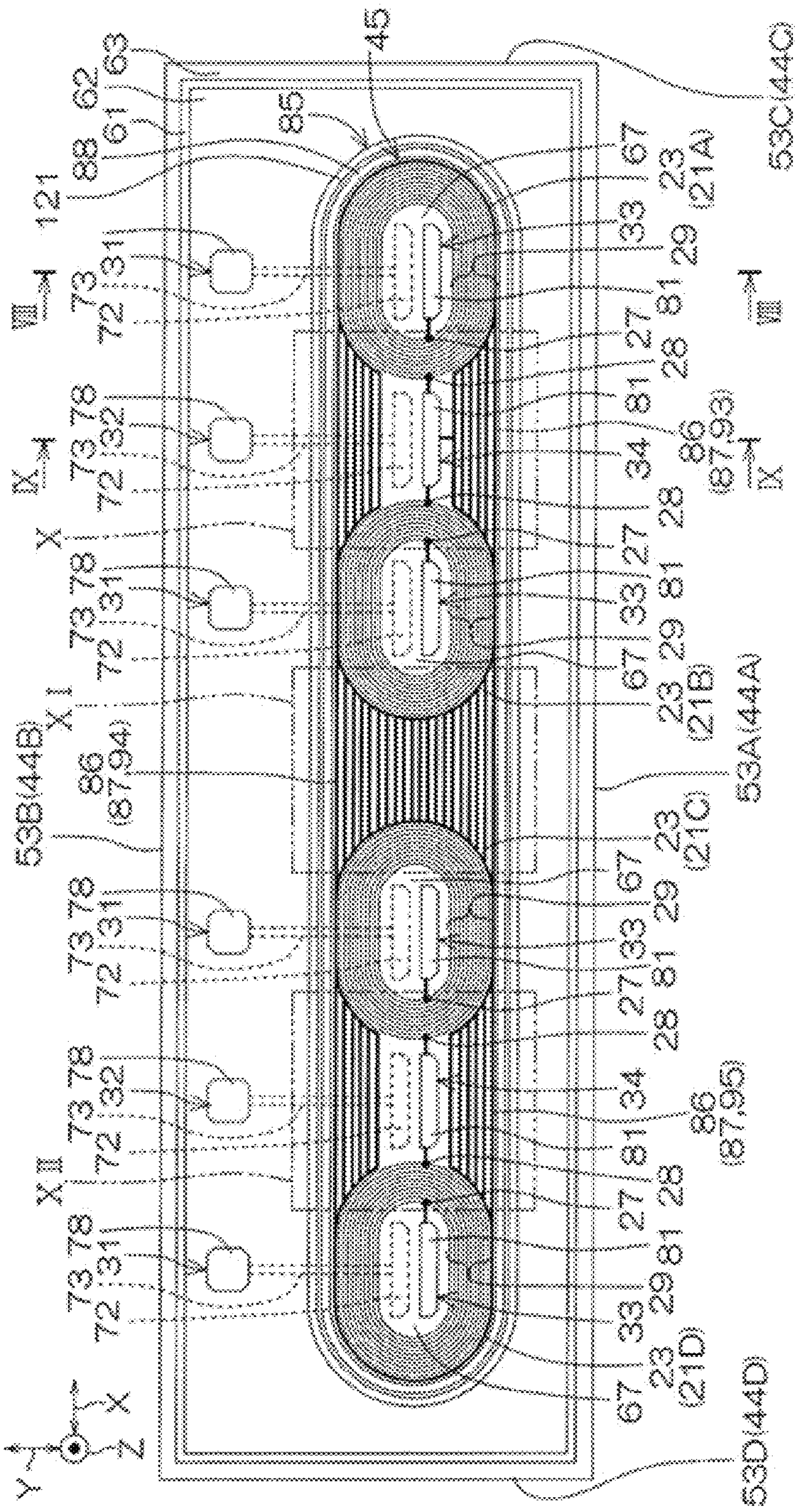
FIG. 6 is a plan view of a layer in the semiconductor device shown in FIG. 3 where high-potential coils are formed.
Figure 7:
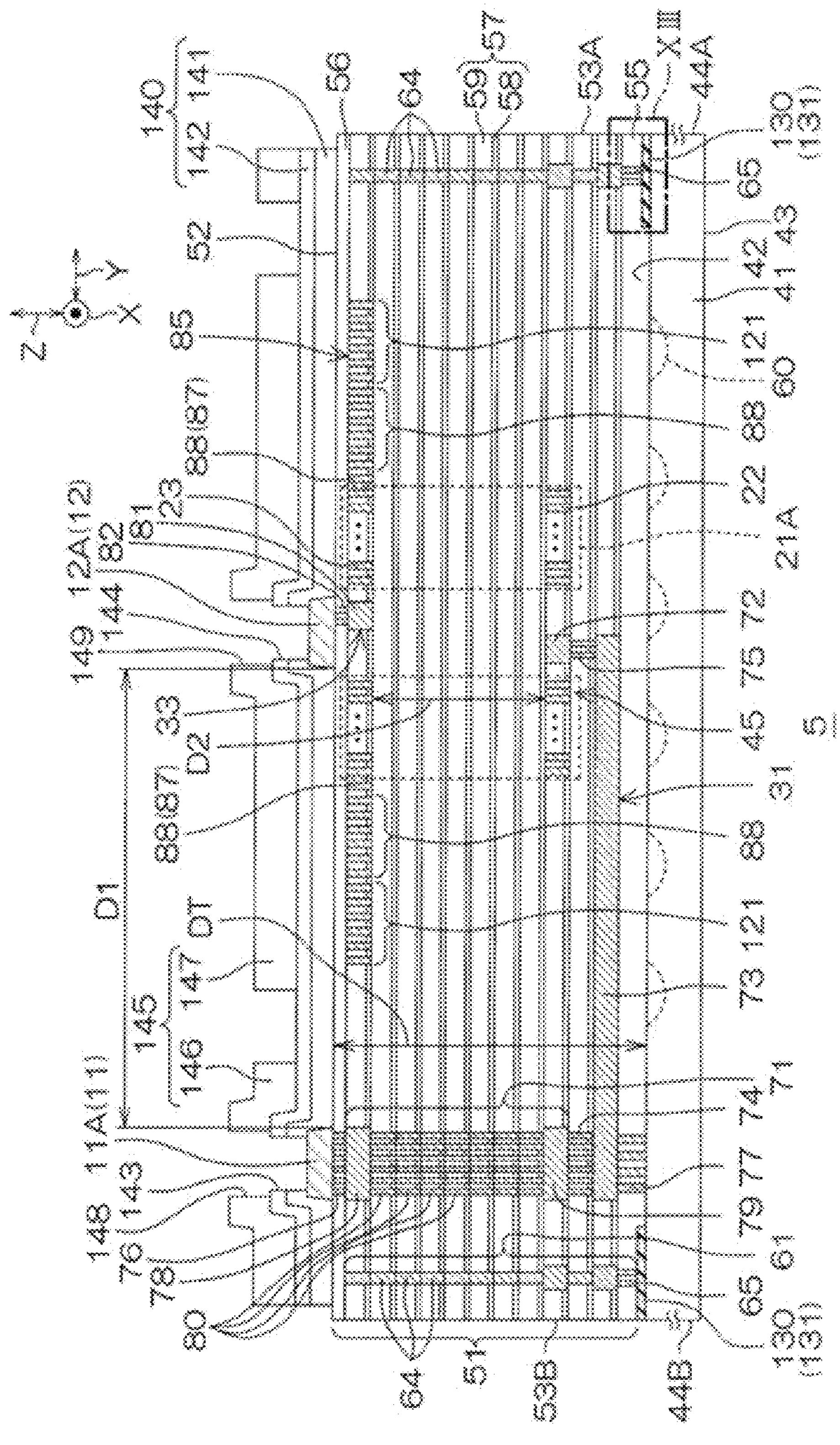
FIG. 7 is a cross-sectional view taken along line VIII-VIII shown in FIG. 6.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV). Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multilayer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view, the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view, the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer.

The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 50 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated.

Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Figure 8:
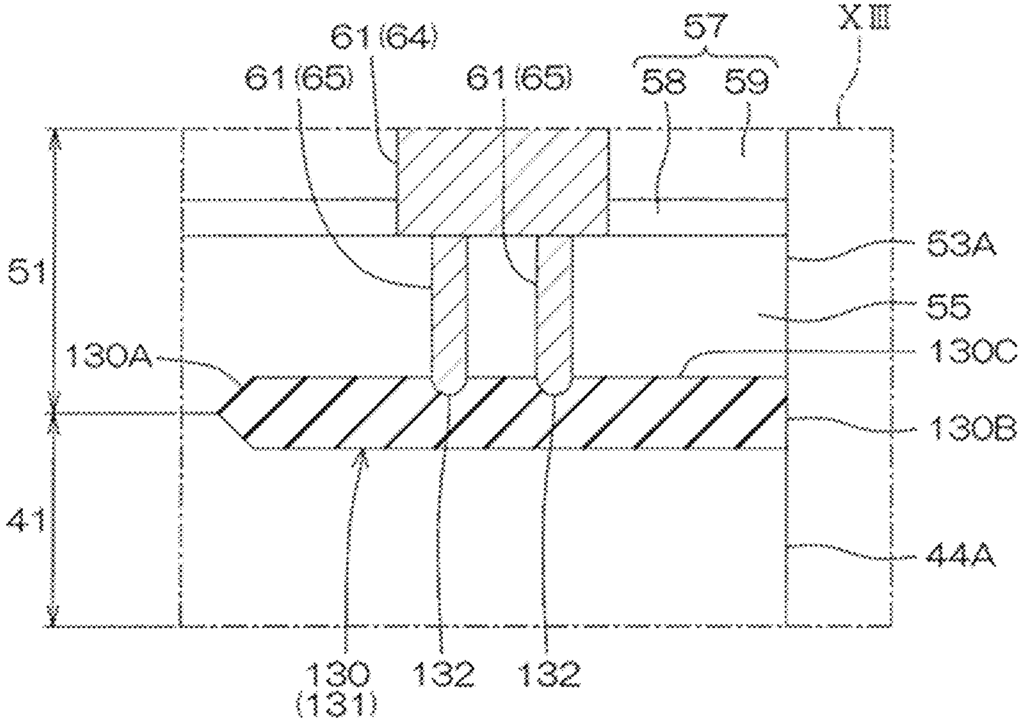
FIG. 8 is an enlarged view (showing a separation structure) of region XIII shown in FIG. 7.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 μm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present invention can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
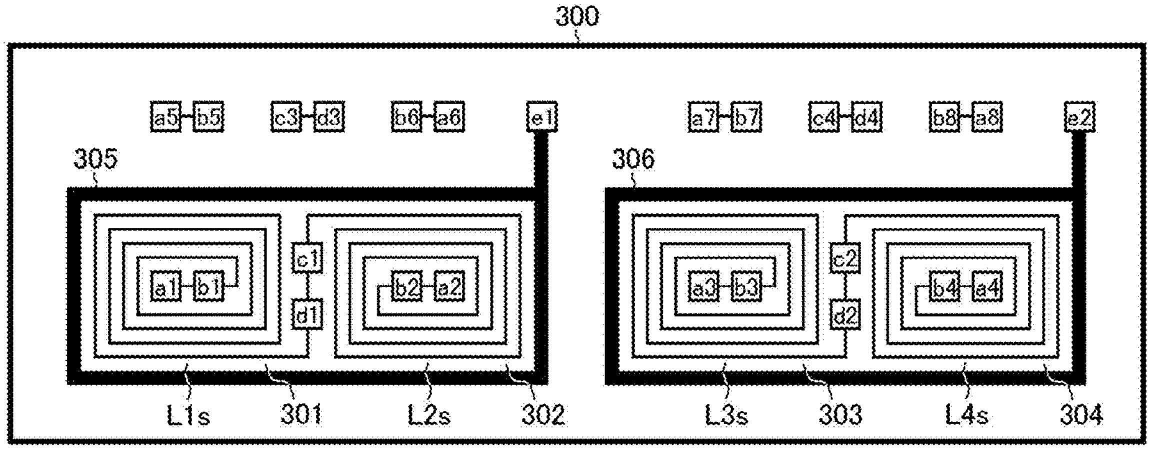
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1*s* of the first transformer 301, and the pads c1 and d1 are connected to the other terminal of that secondary coil L1*s*. The pads a2 and b2 are connected to one terminal of the secondary coil L2*s* of the second transformer 302, and the pads c1 and d1 are connected to the other terminal of that secondary coil L2*s*.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1s and L2s. The pads c2 and d2 are shared between the secondary coils L3s and L4s. The pads c3 and d3 are shared between the primary coils L1p and L2p. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

<Electronic Device 400>

The signal transmission device 200 described above can be used in an electronic device 400. The electronic device 400 will be described in detail.

Figure 10:
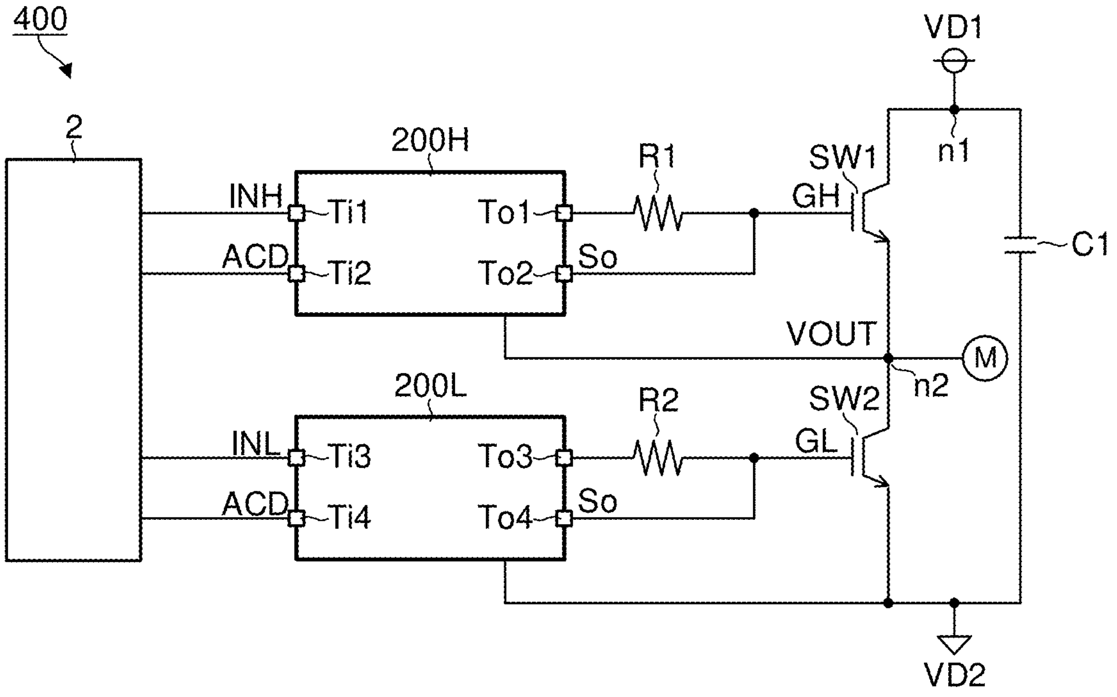
FIG. 10 is a diagram showing the basic configuration of an electronic device incorporating the signal transmission device.

FIG. 10 is a diagram showing the basic configuration of an electronic device 400 in which the signal transmission devices 200H and 200L are mounted. The electronic device 400 of this configuration example is a type of motor driving device that converts DC power supplied from an unillustrated vehicle-mounted battery into AC power to drive a motor M. The motor M is a three-phase motor that is rotationally driven according to three-phase driving voltages input respectively from three-phase half-bridge output stages (see FIG. 16 which will be described later). Note that FIG. 10 shows only one phase of the three-phase half-bridge output stages.

As shown in FIG. 10, the electronic device 400 of this configuration example has an ECU [Electronic Control Unit] 2, signal transmission devices 200H and 200L, and a plurality of discrete components (switching devices SW1 and SW2, resistors R1 and R2, and capacitor C1).

The first terminal of the capacitor C1 is connected to the application terminal of a first motor driving voltage VD1 along with the collector of the switching device SW1. The second terminal of the capacitor C1 is connected to the application terminal of a second motor driving voltage VD2 along with the emitter of the switching device SW2. The capacitor C1 smooths and stabilizes the DC voltage (the voltage between the application terminals of the first motor driving voltage VD1 and the second motor driving voltage VD2) that fluctuates according to variations in the power consumption of the motor M.

The ECU 2 is a means for comprehensively performing electrical control of the electronic device 400 and a vehicle A (see FIG. 17 which will be described later) in which the electronic device 400 is mounted. The ECU 2 drives the switches SW1 and SW2 by switching input signals INH and INL between high level (with respect to VCC1) and low level (with respect to GND1). The ECU 2 also sets the logic level of a discharge signal ACD (external signal) to either high level (with respect to VCC1, first logic level) or low level (with respect to GND1, second logic level) depending on whether to execute the capacitor C1 discharge function (details will be described later).

The signal transmission devices 200H and 200L are semiconductor integrated circuit devices. The signal transmission devices 200H and 200L correspond to the signal transmission device 200 described earlier.

The signal transmission device 200H has terminals (specifically in this figure, the first input terminal Ti1, the second input terminal Ti2, the first output terminal To1, and the second output terminal To2) as means of communication with external devices.

The first input terminal Ti1 receives an input signal INH from the ECU 2. The second input terminal Ti2 receives the discharge signal ACD from the ECU 2. The first output terminal To1 is connected to the first terminal of a resistor R1. The second output terminal To2 is connected to the gate of the switching device SW1 along with the second terminal of the resistor R1.

The signal transmission device 200L has terminals (specifically in this figure, the third input terminal Ti3, fourth input terminal Ti4, third output terminal To3, and fourth output terminal To4) as means of communication with external devices.

The third input terminal Ti3 receives an input signal INL from the ECU 2. The fourth input terminal Ti4 receives the discharge signal ACD from the ECU 2. The third output terminal To3 is connected to the first terminal of a resistor R2. The fourth output terminal To4 is connected to the gate of the switching device SW2 along with the second terminal of the resistor R2.

The switching devices SW1 and SW2 are IGBTs. The collector of the switching device SW1 is connected to the application terminal of the first motor driving voltage VD1. The emitter of the switching device SW1 is connected to the collector of the switching device SW2. The emitter of the switching device SW2 is connected to the application terminal of the second motor driving voltage VD2.

The switching devices SW1 and SW2 constitute a half-bridge output stage. An output voltage VOUT is output from the connection node between the switching device SW1 and switching device SW2. The application terminal of the output voltage VOUT is connected to the motor M, which is the driving target of the electronic device 400.

For convenience of explanation, the connection node between the collector of the switching device SW1 and the application terminal of the first motor driving voltage VD1 will be called node n1. Also, the connection node between the emitter of the switching device SW1 and the collector of the switching device SW2 (=output terminal of output voltage VOUT) will be called node n2.

The signal transmission device 200H generates a driving signal GH according to the input signal INH and the discharge signal ACD, and performs drive control of the switching device SW1 using the driving signal GH. The signal transmission device 200L generates a driving signal GL according to the input signal INL and the discharge signal ACD, and performs drive control of the switching device SW2 using the driving signal GL.

<Soft Turn-Off Function of Signal Transmission Devices 200H and 200L>

The signal transmission devices 200H and 200L have the soft turn-off function described above. Soft turn-off is a turn-off operation where the slew rate of the gate voltage falling edge is lower than in normal turn-off, and the transition time from ON state to OFF state is relatively long.

When performing soft turn-off of the switching device SW1, the signal transmission device 200H sets the first output terminal To1 to high impedance state while outputting a soft turn-off signal So from the second output terminal To2. This makes the driving signal GH equivalent to the soft turn-off signal So. The soft turn-off signal So turns off with a relatively gentle slew rate from high level (with respect to VCC2, which will be described later) toward low level (with respect to VEE2, which will be described later). According to this soft turn-off signal So, the switching device SW1 turns off more gently than in normal turn-off.

Similarly, when performing soft turn-off of the switching device SW2, the signal transmission device 200L sets the third output terminal To3 to high impedance state while outputting a soft turn-off signal So from the fourth output terminal To4. This makes the driving signal GL equivalent to the soft turn-off signal So. The soft turn-off signal So turns off with a relatively gentle slew rate from high level (with respect to VCC2, which will be described later) toward low level (with respect to VEE2, which will be described later). According to this soft turn-off signal So, the switching device SW2 turns off more gently than in normal turn-off.

<Capacitor Discharge Function Using Soft Turn-Off Function>

The electronic device 400 has a function to draw out charge (=discharge) from the capacitor C1 for smoothing the DC voltage at any timing such as during a protective operation. When executing this discharge function, the ECU 2 raises the discharge signal ACD to high level. This causes the signal transmission devices 200H and 200L to perform drive control of the switches SW1 and SW2 through a predetermined operation to discharge the capacitor C1. When executing this discharge function, the signal transmission devices 200H and 200L drive-control the switches SW1 and SW2 in the following way, for example.

The signal transmission devices 200H and 200L drive-control the switching devices SW1 and SW2 such that two states alternate: a first state where the switching device SW1 is ON and the switching device SW2 is soft-turned-off, and a second state where the switching device SW1 is soft-turned-off and the switching device SW2 is ON. Then, during each of the first and second states, there are timings when both switching devices SW1 and SW2 are ON. At these timings, current flows from the capacitor C1. This reduces the charge amount in the capacitor C1. Since the discharge amount (magnitude of flowing current) is smaller than when both switching devices SW1 and SW2 are fully ON to discharge from the capacitor C1, it is possible to suppress destruction of the switching devices SW1 and SW2 and capacitor C1 due to overcurrent.

By controlling the length of the period in which both switching devices SW1 and SW2 are ON as described above, it is possible to control the amount of charge drawn from the capacitor C1. For example, when the period in which both switching devices SW1 and SW2 are ON is long, the amount of charge drawn from the capacitor C1 becomes large. Conversely, when the period in which both switching devices SW1 and SW2 are ON is short, the amount of charge drawn from the capacitor C1 becomes small.

<Considerations on Soft Turn-Off Operation Timing>

However, when discharging the capacitor C1 using the soft turn-off function as described above, it is necessary to strictly control the ON/OFF timing of the switching devices SW1 and SW2. Specifically, it is necessary to control the ON/OFF timing of the switching devices SW1 and SW2 such that the ON period of one switching device overlaps with the soft turn-off period (more specifically, the ON period during soft turn-off operation) of the other switching device. The ON periods and soft turn-off periods of the switching devices SW1 and SW2 are relatively short. Furthermore, to draw charge from the capacitor C1 at a desired discharge amount, the period in which both switching devices SW1 and SW2 are ON must be controlled even more strictly. Therefore, in an electronic device that discharges a smoothing capacitor using the soft turn-off function, like the electronic device 400 described above, there is a risk that the control system and other components become complex, leading to increased manufacturing costs.

For such a problem, using the signal transmission device 200X of the present disclosure described below in the electronic device 400 enables discharging the capacitor C1 with relatively simple control. The signal transmission device 200X according to the present disclosure and the electronic device 400 incorporating it will be described below.

<Signal Transmission Device 200X According to the Present Disclosure>

Figure 11:
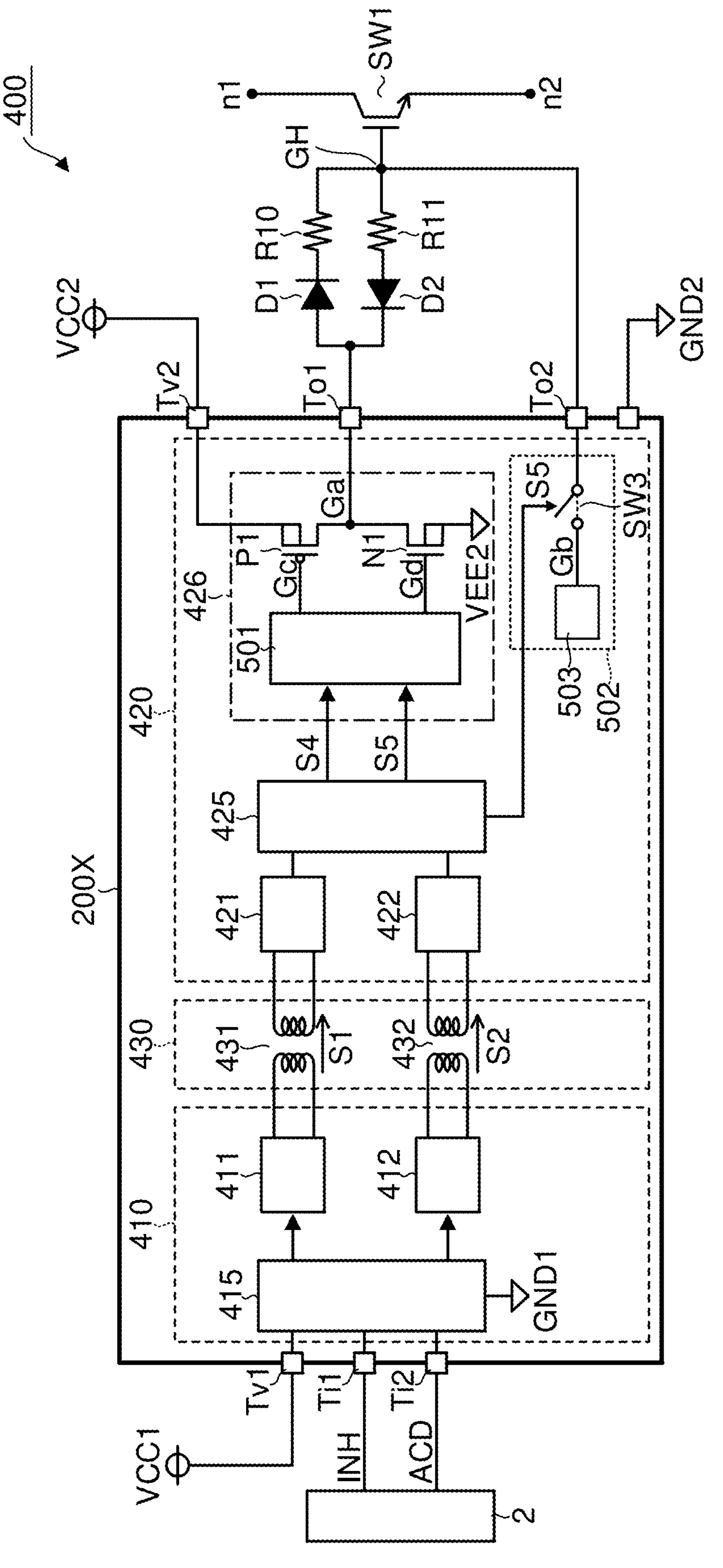
FIG. 11 is a diagram showing the signal transmission device according to the present disclosure and an electronic device incorporating it.

FIG. 11 is a diagram showing the signal transmission device 200X according to the present disclosure and the electronic device 400 incorporating it. As shown in FIG. 11, the electronic device 400 has an ECU 2, a signal transmission device 200X, and a plurality of discrete components (the switching device SW1, resistors R10 and R11).

The signal transmission device 200X is configured to transmit a gate driving signal from a primary circuit system (VCC1-GND1) to a secondary circuit system (VCC2-GND2) while isolating between the primary circuit system and the secondary circuit system. Note that the signal transmission device 200X corresponds to the signal transmission device 200H described earlier. Therefore, components common with the signal transmission device 200H are given the same reference numerals and their explanation is omitted.

The signal transmission device 200X has a plurality of external terminals (in this figure: the primary-side power supply terminal Tv1, the secondary-side power supply terminal Tv2, first input terminal Ti1, the second input terminal Ti2, the first output terminal To1, the second output terminal To2) as means for establishing electrical connections with external devices.

The primary-side power supply terminal Tv1 is the power supply terminal of the primary circuit system (=the first semiconductor chip 410 which will be described later). The primary circuit system receives a supply voltage VCC1 via the primary-side power supply terminal Tv1. The secondary-side power supply terminal Tv2 is the power supply terminal of the secondary circuit system (=the second semiconductor chip 420 which will be described later). The secondary circuit system receives a supply voltage VCC2 via the secondary-side power supply terminal Tv2.

The first input terminal Ti1 is a control input terminal. The first input terminal Ti1 receives the input signal INH from the ECU 2. The second input terminal Ti2 is a control input terminal separate from the first input terminal Ti1. The second input terminal Ti2 is connected to the ECU 2. The second input terminal Ti2 receives the discharge signal ACD from the ECU 2.

The first output terminal To1 and the second output terminal To2 are signal output terminals for outputting driving signals GH (more specifically, driving signals Ga and Gb) to drive the switching device SW1.

The first output terminal To1 is connected to the gate terminal of the switching device SW1 via resistors R10 and R11 and diodes D1 and D2. The first output terminal To1 outputs the driving signal Ga.

The second output terminal To2 is connected to the gate of the switching device SW1 along with one terminal of each of the resistors R10 and R11. Under certain conditions, the driving signal Gb (specific voltage) is output from the second output terminal To2. The voltage value of the driving signal GH is determined based on the driving signals Ga and Gb.

The switching device SW1 receives the driving signal GH at its gate and turns ON/OFF according to the driving signal GH. Specifically, when the driving signal GH exceeds the ON threshold voltage of the switching device SW1, the switching device SW1 turns ON, and as the voltage value of the driving signal GH increases further, the collector current of the switching device SW1 increases. Conversely, when the driving signal GH falls below the ON threshold voltage of the switching device SW1, the switching device SW1 turns OFF and collector current stops flowing.

Note that the signal transmission device 200X corresponds to the signal transmission devices 200H and 200L described earlier. Therefore, the electronic device 400 can adopt a configuration (not illustrated) having both the signal transmission device 200X (see FIG. 11) for controlling the drive of the switching device SW1 and the signal transmission device 200X (not illustrated, corresponding to the signal transmission device 200L shown in FIG. 10) for driving the switching device SW2.

<Internal Configuration of Signal Transmission Device 200X>

Next, the internal configuration of the signal transmission device 200X will be described in detail. As shown in FIG. 11, the signal transmission device 200X is formed by sealing a first semiconductor chip 410 (transmission circuit), a second semiconductor chip 420 (reception circuit), and a third semiconductor chip 430 (isolation circuit) in a single package.

The first semiconductor chip 410 corresponds to the primary circuit system 200*p* described earlier. The first semiconductor chip 410 is a controller chip with an integrated controller having signal generation functions. The first semiconductor chip 410 is driven by being supplied with the supply voltage VCC1. The first semiconductor chip 410 generates a first internal signal S1 and a second internal signal S2 based on the input signal INH and the discharge signal ACD.

The first semiconductor chip 410 has a logic circuit 415, a first transmission circuit 411, and a second transmission circuit 412.

The logic circuit 415 receives the supply voltage VCC1, the input signal INH, and the discharge signal ACD. The logic circuit 415 generates the first internal signal S1 and the second internal signal S2 that pulse-drive at a predetermined period according to the input signal INH and the discharge signal ACD.

The first transmission circuit 411 and second transmission circuit 412 receive the first internal signal S1 and the second internal signal S2 from the logic circuit 415. The first transmission circuit 411 transmits the input first internal signal S1 to the second semiconductor chip 420 (specifically, the first reception circuit 421 which will be described later) via the third semiconductor chip 430 (specifically, the first transformer 431 which will be described later). The second transmission circuit 412 transmits the input second internal signal S2 to the second semiconductor chip 420 (specifically, the second reception circuit 422 which will be described later) via the third semiconductor chip 430 (specifically, the second transformer 432 which will be described later).

The second semiconductor chip 420 corresponds to the secondary circuit system 200*s* described earlier. The second semiconductor chip 420 is a driver chip with an integrated driver for controlling the drive of the switching device SW1.

The second semiconductor chip 420 is driven by being supplied with the supply voltage VCC2. The second semiconductor chip 420 generates the driving signal GH according to the received first internal signal S1 and second internal signal S2 and controls the drive of the switching device SW1. The detailed configuration of the second semiconductor chip 420 will be described later.

The third semiconductor chip 430 is a transformer chip with a plurality of integrated transformers (the first transformer 431 and second transformer 432 which will be described later). The third semiconductor chip 430 transmits the first internal signal S1 and the second internal signal S2 while DC-isolating between the first semiconductor chip 410 and the second semiconductor chip 420.

The configuration of the second semiconductor chip 420 will be described in detail. The second semiconductor chip 420 has a first reception circuit 421, second reception circuit 422, logic circuit 425, first driving circuit 426, and second driving circuit 502.

The first reception circuit 421 receives the first internal signal S1 from the first transmission circuit 411 via the first transformer 431. The first reception circuit 421 inputs the received first internal signal S1 to the logic circuit 425.

The second reception circuit 422 receives the second internal signal S2 from the second transmission circuit 412 via the second transformer 432. The second reception circuit 422 inputs the received second internal signal S2 to the logic circuit 425.

Based on the first internal signal S1 and the second internal signal S2 inputted, the logic circuit 425 generates a first drive control signal S4 and a second drive control signal S5. The logic circuit 425 inputs the first drive control signal S4 and second drive control signal S5 to the first driving circuit 426 (more specifically, the driver circuit 501). The logic circuit 425 also inputs the second drive control signal S5 to the second driving circuit 502.

The logic circuit 425 is also configured to be able to detect when at least one of the first internal signal S1 and the second internal signal S2 is pulse-driving at a specific period (which will be described later). Specifically, the logic circuit 425 monitors the driving period of the first internal signal S1 and the second internal signal S2 received by the reception circuit 422 and detects whether this driving period is the specific period or not.

When the first internal signal S1 and the second internal signal S2 are not driving at the specific period, the logic circuit 425 outputs the first drive control signal S4 according to the first internal signal S1 and the second internal signal S2 while setting the second drive control signal S5 to low level (third logic level).

When the logic circuit 425 detects that at least one of the first internal signal S1 and the second internal signal S2 is pulse-driving at the specific period, it sets the second drive control signal S5 to high level (fourth logic level). More detailed configuration of the logic circuit 425 will be described later.

The first driving circuit 426 switches between a valid state (state of outputting the driving signal Ga) and an invalid state (state of not outputting the driving signal Ga) according to the second drive control signal S5. For example, the first driving circuit 426 enters the valid state when the second drive control signal S5 is low level and enters the invalid state when the second drive control signal S5 is high level. Also, when in the valid state, the first driving circuit 426 outputs the driving signal Ga according to the first drive control signal S4. The detailed configuration of the first driving circuit 426 is as follows.

The first driving circuit 426 has a driver circuit 501, a transistor P1, and a transistor N1. The driver circuit 501 outputs driving signals Gc and Gd based on the input first drive control signal S4 and the second drive control signal S5.

The transistor P1 is a P-channel type MOSFET [Metal Oxide Semiconductor Field Effect Transistor]. The transistor N1 is an N-channel type MOSFET. The source terminal of the transistor P1 is connected to the secondary-side power supply terminal Tv2. The drain terminals of the transistors P1 and N1 are both connected to the first output terminal To1. The source terminal of the transistor N1 is connected to the application terminal of the reference voltage VEE2. The reference voltage VEE2 is at a lower voltage than the supply voltage VCC2. The gate terminals of the transistors P1 and N1 are connected to the driver circuit 501.

The transistor P1 receives the driving signal Gc at its gate terminal and is turned ON/OFF controlled by the driving signal Gc. The transistor N1 receives the driving signal Gd at its gate terminal and is turned ON/OFF controlled by the driving signal Gd. When in the invalid state described above, the first driving circuit 426 outputs driving signals Gc and Gd to turn OFF both transistors P1 and N1.

When the first driving circuit 426 is in the valid state described above, the driving signal Ga at high level (=VCC2 level, sixth logic level) or low level (=VEE2 level, fifth logic level) appears at the first output terminal To1 according to the ON/OFF states of the transistors P1 and N1 respectively.

When the first driving circuit 426 is in the invalid state, the first output terminal To1 (=the gate of the switching device SW1) is in a high impedance state.

The second driving circuit 502 switches between a valid state and an invalid state according to the second drive control signal S5. For example, the second driving circuit 502 enters the invalid state when the second drive control signal S5 is low level and enters the valid state when the second drive control signal S5 is high level. When in the valid state, the second driving circuit 502 outputs the driving signal Gb. On the other hand, when in the invalid state, the second driving circuit does not output the driving signal Gb. The detailed configuration of the second driving circuit 502 is as follows.

Figure 12:
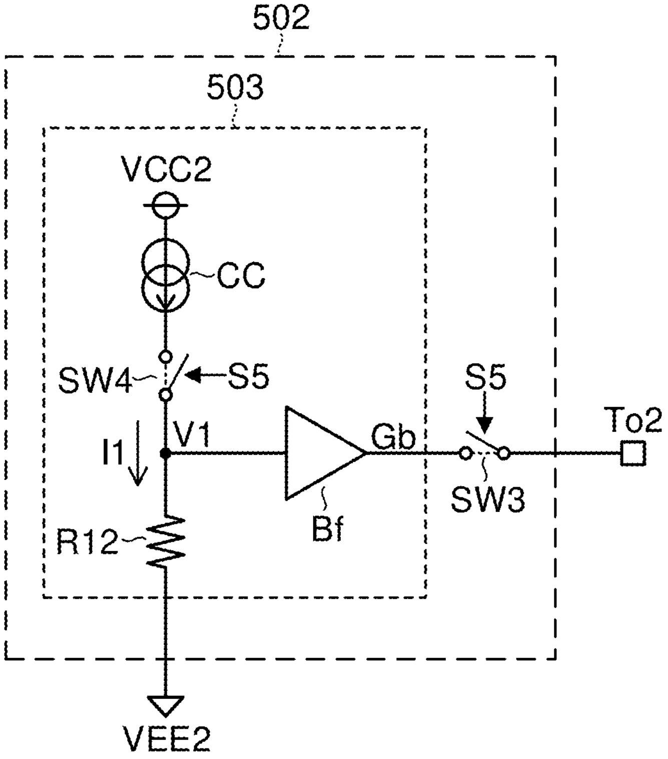
FIG. 12 is a diagram showing the detailed configuration of the second driving circuit.

FIG. 12 is a diagram showing the detailed configuration of the second driving circuit 502. As shown in FIGS. 11 and 12, the second driving circuit 502 includes a switch SW3 (switching circuit) and a constant voltage generation circuit 503 (voltage generation circuit).

The switch SW3 is connected between the constant voltage generation circuit 503 and the second output terminal To2. The switch SW3 switches between ON (conductive state) and OFF (non-conductive state) according to the second drive control signal S5. For example, the switch SW3 turns ON when the second drive control signal S5 is high level and turns OFF when the second drive control signal S5 is low level.

The constant voltage generation circuit 503 includes a constant current source CC, a switch SW4, a resistor R12, and an output buffer Bf.

The constant current source CC receives the supply voltage VCC2 and generates the current I1. The first terminal of the switch SW4 is connected to the output terminal of the constant current source CC. The second terminal of the switch SW4 is connected to the input terminal of the output buffer Bf along with the first terminal of the resistor R12. The second terminal of the resistor R12 is connected to the application terminal of the reference voltage VEE2.

The switch SW4 switches between ON (conductive state) and OFF (non-conductive state) according to the second drive control signal S5. For example, the switch SW4 turns ON when the second drive control signal S5 is high level and turns OFF when the second drive control signal S5 is low level.

The valid state of the second driving circuit 502 described above is specifically as follows. When the second drive control signal S5 is high level, the switches SW3 and SW4 turn ON and the current I1 flows from the constant current source CC to the resistor R12. At this time, a voltage V1 corresponding to the current I1 and the resistance value of the resistor R12 appears across the resistor R12. The voltage V1 across the resistor R12 is input to the input terminal of the output buffer Bf. The output buffer Bf buffer-processes the voltage V1 across the resistor R12 and outputs it as the driving signal Gb from its output terminal. This applies the driving signal Gb to the gate of the switching device SW1 via the second output terminal To2. The voltage value of the driving signal Gb is higher than the ON threshold voltage value of the switching device SW1 and lower than the voltage value of the high-level driving signal Ga.

The invalid state of the second driving circuit 502 described above is when the second drive control signal S5 is low level, the switches SW3 and SW4 are OFF, and the current I1 is not flowing from the constant current source CC to the resistor R12. At this time, since the second driving circuit 502 and the second output terminal To2 are in a non-shorted state, the driving signal Gb is not output from the second output terminal To2.

When executing the discharge function described above, the first driving circuit 425 is set to the invalid state to put the first output terminal To1 (=the gate of the switching device SW1) in a high impedance state, and the second driving circuit 502 is set to the valid state to apply the driving signal Gb to the gate of the switching device SW1 from the second output terminal To2.

At this time, a high-level driving signal GL (=driving signal GL corresponding to high-level driving signal Ga) is applied to the gate of the switching device SW2 to fully turn ON the switching device SW2 (not illustrated). This causes current to flow from the capacitor C1, and charge is drawn out.

<Detailed Configuration of Logic Circuits 415 and 425>

Figure 13:
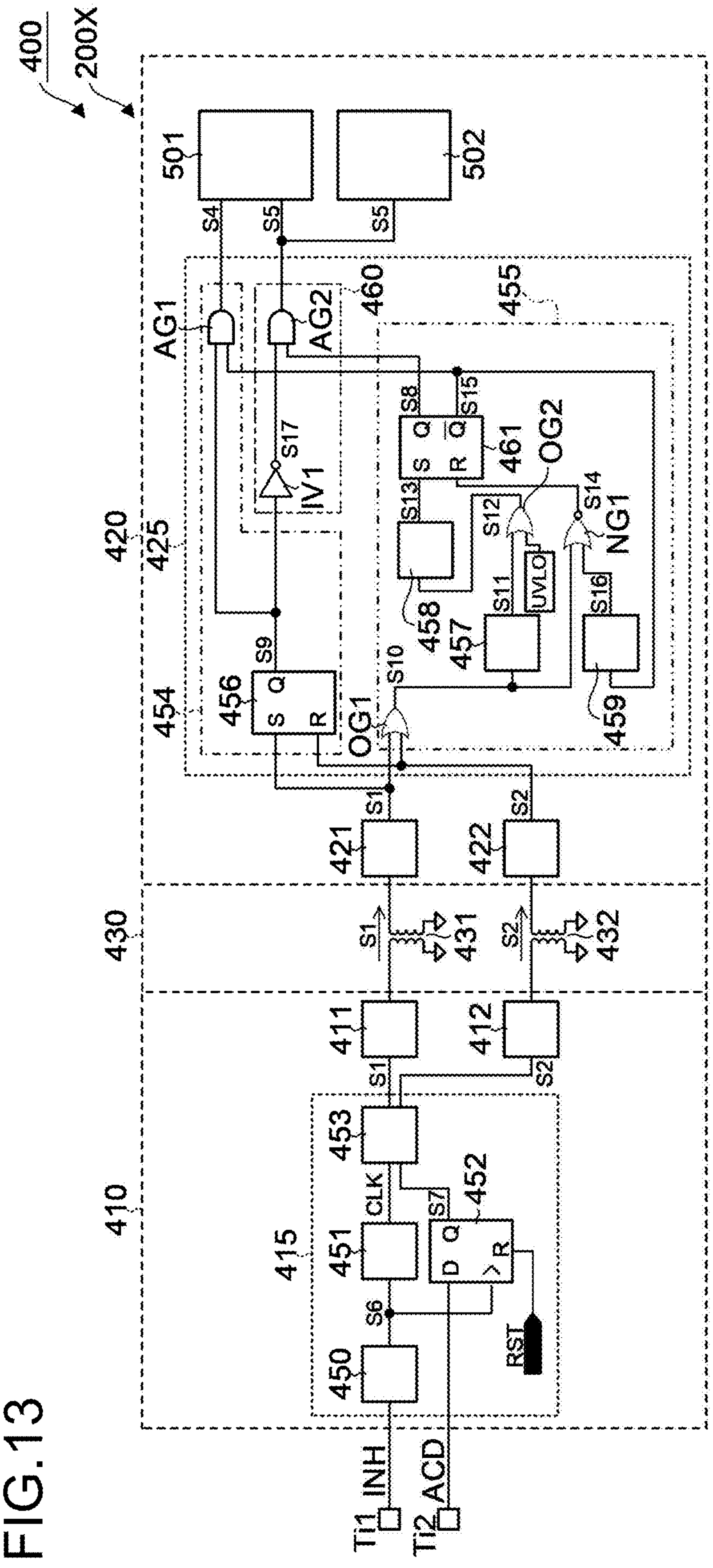
FIG. 13 is a diagram showing the detailed configuration of the logic circuit.

Next, the more detailed configuration of logic circuits 415 and 425 will be described. FIG. 13 is a diagram showing the detailed configuration of the logic circuits 415 and 425. As shown in FIG. 13, the logic circuit 415 includes an edge detection circuit 450, a clock circuit 451, a D flip-flop 452, and a pulse generation circuit 453.

The edge detection circuit 450 is connected to the first input terminal Ti1. The edge detection circuit 450 receives the input signal INH via the first input terminal Ti1 and generates an edge detection signal S6. When the edge detection circuit 450 detects either a rising edge or falling edge of the input signal INH, it generates one pulse in the edge detection signal S6 after a predetermined time has elapsed from the detection point (for example, 50 ns after detection).

The clock circuit 451 receives the edge detection signal S6 and generates a clock signal CLK according to the edge detection signal S6, which it inputs to the pulse generation circuit 453. Specifically, the clock circuit 451 generates the clock signal CLK to pulse-drive at a predetermined period starting from the timing of the pulse edge generated in the edge detection signal S6.

The D flip-flop 452 has the discharge signal ACD input to its input terminal (D), the edge detection signal S6 input to its input terminal (CK), and the reset signal RST input to its reset terminal (R). Based on the discharge signal ACD and edge detection signal S6, the D flip-flop 452 outputs a control signal S7 from its output terminal (Q). Specifically, it operates as follows.

When a pulse is generated in the edge detection signal S6, the D flip-flop 452 sets the logic level of the discharge signal ACD at its input terminal (D) at the timing of the pulse edge (for example, rising edge) of the edge detection signal S6. This causes the D flip-flop 452 to make the logic level of the control signal S7 the same as the logic level at the input terminal (D).

In other words, even if the discharge signal ACD rises from low level to high level, the control signal S7 is maintained at low level until a pulse is generated in the edge detection signal S6 (=until the edge detection circuit 450 detects a rising edge or falling edge of the input signal INH). That is, when the discharge signal ACD is at high level and a pulse is generated in the edge detection signal S6 (=when the edge detection circuit 450 detects a rising edge or falling edge of the input signal INH), the control signal S7 is raised to high level.

Note that the reset signal RST is generated by the ECU 2. At any timing when not executing the discharge function, the ECU 2 raises the reset signal RST from low level to high level. When the reset signal RST rises to high level, the logic level set at the input terminal (D) is reset (becomes low level).

The pulse generation circuit 453 receives the clock signal CLK and the control signal S7 and generates the first internal signal S1 and the second internal signal S2 according to the clock signal CLK and the control signal S7. Based on the clock signal CLK and the control signal S7, the pulse generation circuit 453 pulse-drives one of the first internal signal S1 and the second internal signal S2 at either a standard period or a specific period while maintaining the other at low level. Specifically, it operates as follows.

When the input signal INH is high level and the control signal S7 is low level (=when the discharge signal ACD is low level), the pulse generation circuit 453 pulse-drives the first internal signal S1 at the standard period based on the clock signal CLK while maintaining the second internal signal S2 at low level.

When the input signal INH is low level and the control signal S7 is low level, the pulse generation circuit 453 pulse-drives the second internal signal S2 at the standard period based on the clock signal CLK while maintaining the first internal signal S1 at low level.

Also, when the control signal S7 is high level, the pulse generation circuit 453 pulse-drives one of the first internal signal S1 and the second internal signal S2 at the specific period while maintaining the other at low level. More specifically, it operates as follows.

When the control signal S7 is raised to high level because the edge detection circuit 450 detected a rising edge of the input signal INH, both the input signal INH and the discharge signal ACD are at high level. At this time, the pulse generation circuit 453 pulse-drives the first internal signal S1 at the specific period while maintaining the second internal signal S2 at low level.

Conversely, when the edge detection circuit 450 detects a falling edge of the input signal INH and the control signal S7 is raised to high level, the input signal INH is at low level and the discharge signal ACD is at high level. At this time, the pulse generation circuit 453 pulse-drives the second internal signal S2 at the specific period while maintaining the first internal signal S1 at low level.

Note that the standard period is a predetermined period (for example, 100 ns) that is set to correspond to the normal ON/OFF period of the switching device SW1 (=when not executing the discharge function). The specific period is a period shorter than the standard period (for example, 25 ns).

After starting to pulse-drive the first internal signal S1 or the second internal signal S2 at the specific period, the pulse generation circuit 453 sets both the first internal signal S1 and the second internal signal S2 to low level after a predetermined pulse stop time Td has elapsed. The pulse stop time Td is set longer than the second time Tb, which will be described later, and shorter than the time obtained by adding a second time Tb and third time Tc. Also, the pulse stop time Td is set shorter than the third time Tc. For example, the pulse stop time Td may be set to 0.5 μs (see FIG. 14 which will be described later).

Next, the detailed configuration of the logic circuit 425 will be described. As shown in FIG. 13, the logic circuit 425 includes a driver control circuit 454, a detection circuit 455, and a discharge control circuit 460.

The driver control circuit 454 generates the first drive control signal S4 according to the first internal signal S1 and the second internal signal S2.

The detection circuit 455 is configured to be able to detect whether either one of the first internal signal S1 and the second internal signal S2 is pulse-driving at the specific period by monitoring the first internal signal S1 and the second internal signal S2. The detection circuit 455 generates a detection signal S8 according to the detection result.

The discharge control circuit 460 generates the second drive control signal S5 according to the first internal signal S1, the second internal signal S2, and the detection signal S8. The detailed configurations of the driver control circuit 454, detection circuit 455, and discharge control circuit 460 are as follows.

The driver control circuit 454 includes an RS flip-flop 456 and an AND gate AG1.

The RS flip-flop 456 receives the first internal signal S1 at its set input terminal(S) from the first reception circuit 421. The RS flip-flop 456 receives the second internal signal S2 at its reset input terminal (R) from the second reception circuit 422. Based on the first internal signal S1 and the second internal signal S2, the RS flip-flop 456 outputs a control signal S9 from its output terminal (Q).

The AND gate AG1 receives the control signal S9 at its first input terminal and an inverted signal S15, which will be described later, at its second input terminal. The AND gate AG1 outputs the first drive control signal S4 according to the control signal S9 and the inverted signal S15.

The detection circuit 455 includes OR gates OG1 and OG2, a NOR gate NG1, a first timer circuit 457, a second timer circuit 458, a third timer circuit 459 (mask circuit), and an RS flip-flop 461.

The OR gate OG1 receives the first internal signal S1 at its first input terminal from the first reception circuit 421. The OR gate OG1 receives the second internal signal S2 at its second input terminal from the second reception circuit 422. Based on the first internal signal S1 and the second internal signal S2, the OR gate OG1 outputs a monitoring signal S10 from its output terminal. More specifically, it operates as follows.

The OR gate OG1 sets the monitoring signal S10 to high level when at least one of the first internal signal S1 and the second internal signal S2 is at high level. Also, the OR gate OG1 sets the monitoring signal S10 to low level when both the first internal signal S1 and the second internal signal S2 are at low level.

The first timer circuit 457 receives the monitoring signal S10 and outputs the first timer signal S11 according to the monitoring signal S10. Specifically, the first timer circuit 457 raises the logic level of the first timer signal S11 from low level to high level in synchronization with the rising edge of the monitoring signal S10. Also, the first timer circuit 457 drops the logic level of the first timer signal S11 from high level to low level when a predetermined first time Ta (see FIG. 14 which will be described later) has elapsed from the timing of the rising edge of the first timer signal S11.

The first time Ta is set shorter than the standard period and longer than the specific period. For example, when the standard period is set to 100 ns and the specific period is set to 25 ns, the first time Ta can be set to a value larger than 25 ns and less than 100 ns (for example, 40 ns).

The OR gate OG2 receives the first timer signal S11 at its first input terminal. The OR gate OG2 receives an under-voltage lockout UVLO signal output from an UVLO circuit at its second input terminal. Based on the UVLO signal and the first timer signal S11, the OR gate OG2 outputs the control signal S12 from its output terminal. More specifically, it operates as follows.

The under-voltage lockout circuit UVLO is designed to prevent malfunction of the detection circuit 455 by putting the detection circuit 455's function in standby state (=temporary stop state) when the supply voltage falls below a predetermined lower limit voltage. As long as the supply voltage VCC2 does not fall below the lower limit voltage, the under-voltage lockout circuit UVLO basically outputs a low-level output signal. That is, as long as the supply voltage VCC2 does not fall below the lower limit voltage mentioned above, the OR gate OG2 outputs the control signal S12 with a logic level equivalent to the first timer signal S11.

The second timer circuit 458 receives the control signal S12 and outputs the second timer signal S13 according to the control signal S12. Specifically, it operates as follows.

The second timer circuit 458 is configured to be able to detect whether the duration of the high-level control signal S12 (=the time from when the first timer signal S11 rises to high level as the start point until the first timer signal S11 next falls to low level) exceeds a predetermined second time Tb (first period). The second timer circuit 458 outputs the second timer signal S13 according to this detection result.

Specifically, until the duration of the high-level control signal S12 reaches the second time Tb, the second timer circuit 458 sets the logic level of the second timer signal S13 to low level. On the other hand, when the duration of the high-level control signal S12 reaches the second time Tb, the second timer circuit 458 raises the logic level of the second timer signal S13 to high level and maintains the logic level of the second timer signal S13 at high level until the control signal S12 falls to low level. The second time Tb is set to a time longer than the first time Ta (for example, 200 ns).

The RS flip-flop 461 receives the second timer signal S13 at its set input terminal (S). The RS flip-flop 461 receives a control signal S14 which will be described later at its reset input terminal (R). Based on the second timer signal S13 and the control signal S14, the RS flip-flop 461 outputs the detection signal S8 from its output terminal (Q) and outputs the inverted signal S15 from its inverted output terminal (−Q). The inverted signal S15 is a signal with a logic level inverted from the detection signal S8.

The third timer circuit 459 receives the inverted signal S15 and outputs the third timer signal S16 according to the inverted signal S15. Specifically, it operates as follows.

The third timer circuit 459 sets the third timer signal S16 to low level upon receiving the high-level inverted signal S15. Also, the third timer circuit 459 maintains the third timer signal S16 at high level for a predetermined third time Tc (second period) from the timing when the inverted signal S15 falls to low level. When the third time Tc elapses, the third timer circuit 459 drops the third timer signal S16 back to low level.

The NOR gate NG1 receives the monitoring signal S10 at its first input terminal and the third timer signal S16 at its second input terminal. The NOR gate NG1 outputs the control signal S14 according to the monitoring signal S10 and the third timer signal S16. Specifically, it operates as follows.

While the third timer signal S16 is maintained at low level, the NOR gate NG1 pulse-drives the control signal S14 such that the logic level of the control signal S14 is inverted from the pulses of the monitoring signal S10. That is, during this time, the control signal S14 is pulse-driving at the specific period. While the third timer signal S16 is maintained at high level, the NOR gate NG1 maintains the control signal S14 at low level regardless of the logic level of the monitoring signal S10.

Therefore, while the third timer circuit 459 maintains the third timer signal S16 at low level, the RS flip-flop 461 receives the low-level second timer signal S13 at its set input terminal (S) and the control signal S14 pulse-driving at the specific period at its reset input terminal (R). That is, during this time, the RS flip-flop 461 repeatedly alternates between holding and resetting the logic level at its output terminal (Q), continuing to maintain the detection signal S8 at low level.

On the other hand, while the third timer circuit 459 maintains the third timer signal S16 at high level, the RS flip-flop 461 receives the high-level second timer signal S13 at its set input terminal (S) and the control signal S14 maintained at low level at its reset input terminal (R). That is, during this time, the RS flip-flop 461 repeatedly alternates between holding and setting the logic level at its output terminal (Q), continuing to maintain the detection signal S8 at high level. In this way, by the third timer circuit 459 maintaining the third timer signal S16 at high level, the logic level of the detection signal S8 does not change even if the monitoring signal S10 is pulse-driving.

In other words, the third timer circuit 459, when the detection signal S8 is in high-level state (=state where detection circuit 455 has detected that the pulse period of the first internal signal S1 or the second internal signal S2 is the specific period), masks the monitoring signal S10 to prevent the variation in logic level of the first internal signal S1 or the second internal signal S2 from being transmitted to the AND gate AG1 and an AND gate AG2. This prevents the second drive control signal S5 from falling to low level when the detection signal S8 is in high-level state.

The discharge control circuit 460 includes an inverter IV1 and the AND gate AG2. The inverter IV1 receives the control signal S9 and outputs the control signal S17 with a logic level inverted from the control signal S9. The AND gate AG2 receives the control signal S17 at its first input terminal and the inverted signal S15 at its second input terminal. The AND gate AG2 outputs the second drive control signal S5 according to the control signal S17 and the inverted signal S15.

<Internal Control During Discharge Function Execution>

Next, the internal control when executing the discharge function by the signal transmission device 200X will be described. Here, as an example of control when executing the discharge function, it will be explained regarding the case where the control signal S7 is raised to high level because the edge detection circuit 450 detected a falling edge of the input signal INH (=case where the second internal signal S2 pulse-drives at the specific period while the first internal signal S1 is maintained at low level). Although the capacitor C1 can be discharged similarly when the control signal S7 is raised to high level because the edge detection circuit 450 detected a rising edge of the input signal INH (=case where the first internal signal S1 pulse-drives at the specific period while the second internal signal S2 is maintained at low level), that explanation will be omitted here.

Figure 14:
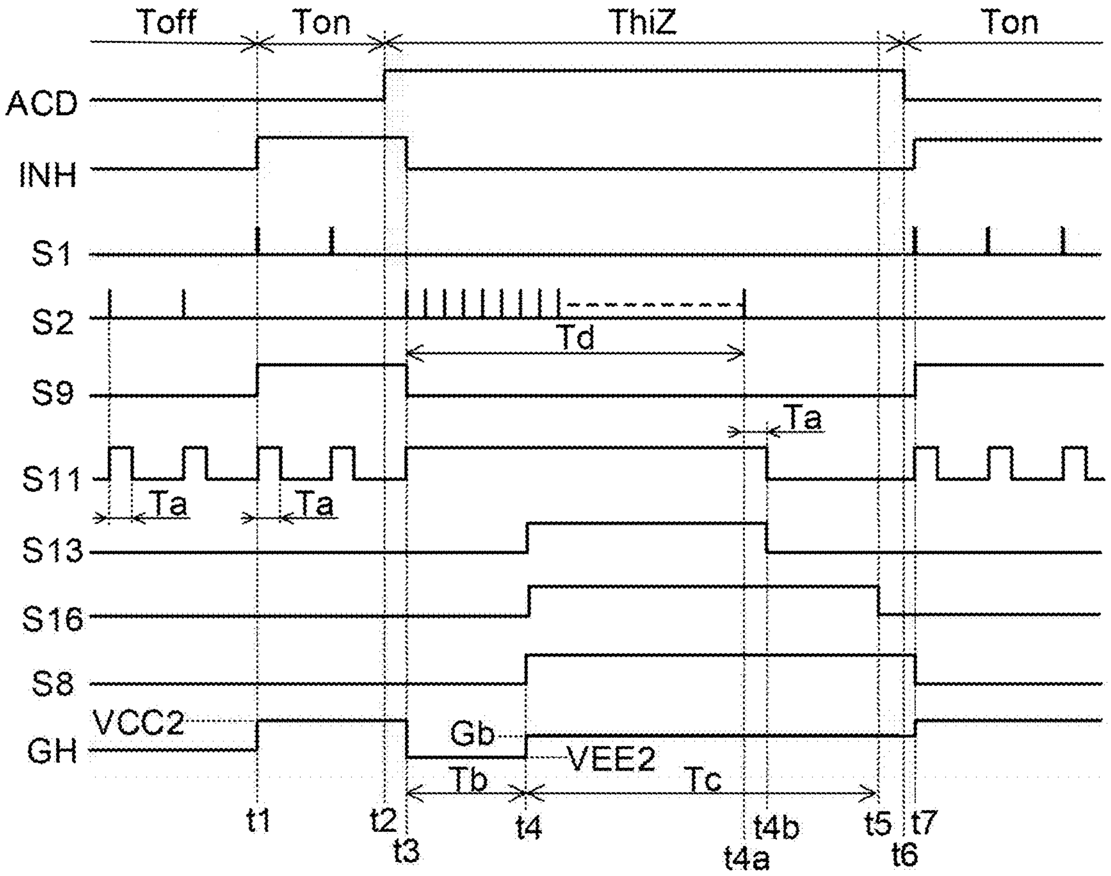
FIG. 14 is a timing chart showing the timing of drive control of a switching device using the signal transmission device.

FIG. 14 is a timing chart showing the timing of drive control of the switching device SW1 using the signal transmission device 200X. FIG. 14 shows, from top to bottom, the discharge signal ACD, the input signal INH, the first internal signal S1, the second internal signal S2, the first timer signal S11, the second timer signal S13, the third timer signal S16, the detection signal S8, the control signal S9, and the driving signal GH.

In FIG. 14, the period from time t1 to time t2 is a period for normal ON/OFF control of the switching device SW1. More specifically, before time t1 is the OFF period Toff of the switching device SW1. Also, the period from time t1 to time t2 is the ON period Ton of the switching device SW1. Also, the period from time t2 to time t6 is a high impedance period ThiZ (=period for executing the discharge function described above) for setting the first output terminal To1 to high impedance state.

From an unillustrated predetermined timing until time t2 is reached, the ECU 2 maintains the discharge signal ACD at low level. Also, from an unillustrated predetermined timing until time t1 is reached, the ECU 2 maintains the input signal INH at low level.

Until time t1, the logic circuit 415, receiving the low-level input signal INH, maintains the first internal signal S1 at low level while pulse-driving the second internal signal S2 at the standard period (in view of this figure, 100 ns).

Also, until time t1, the RS flip-flop 456 receives the first internal signal S1 maintained at low level at its set terminal (S) and the second internal signal S2 pulse-driving at the standard period at its reset terminal (R). Therefore, until time t1 is reached, the RS flip-flop 456 maintains the control signal S9 at low level.

Also, until time t1, the OR gate OG1 receives the first internal signal S1 maintained at low level at its first input terminal and the second internal signal S2 pulse-driving at the standard period at its second input terminal. Therefore, until time t1 is reached, the OR gate OG1 pulse-drives the monitoring signal S10 in synchronization with the second internal signal S2's pulse-driving (illustration omitted).

Also, until time t1, the first timer circuit 457 raises the first timer signal S11 from low level to high level to match the timing of the monitoring signal S10's pulses (=the second internal signal S2's pulses). Then, it maintains the first timer signal S11 at high level until the first time Ta (in view of this figure, 40 ns) elapses from the timing when it raised the first timer signal S11 to high level. At the time when the first time Ta has elapsed from the rising to high level, it drops the first timer signal S11 back to low level. Therefore, before time t1, the first timer signal S11 is a pulse signal having a pulse width of first time Ta.

Also, until time t1, the second timer circuit 458 receives the first timer signal S11 with a pulse width of the first time Ta and sets the second timer signal S13 to low level. In other words, until time t1, the second timer circuit 458 maintains the second timer signal S13 at low level because the duration of the first timer signal S11's high level is the first time Ta and does not reach the second time Tb (in view of this figure, 200 ns).

Also, until time t1, the RS flip-flop 461 receives the low-level second timer signal S13 at its set input terminal (S). Therefore, until time t1 is reached, the RS flip-flop 461 maintains the detection signal S8 at low level regardless of the logic level of the control signal S14 input to its reset input terminal (R). Also, the inverted signal S15 is maintained at high level (illustration omitted).

Also, until time t1, the AND gate AG1 receives the control signal S9 maintained at low level at its first input terminal and the inverted signal S15 maintained at high level at its second input terminal. Therefore, the AND gate AG1 maintains the first drive control signal S4 at low level.

Also, until time t1, the inverter IV1 receives the control signal S9 maintained at low level and maintains the control signal S17 at high level (illustration omitted). Therefore, the AND gate AG2 receives the control signal S17 maintained at high level at its first input terminal and the detection signal S8 maintained at low level at its second input terminal. As a result, the AND gate AG2 maintains the second drive control signal S5 at low level until time t1.

Also, as described above, until time t1, the first drive control signal S4 and the second drive control signal S5 are maintained at low level. As a result, until time t1 is reached, the transistor P1 is OFF, the transistor N1 is ON, and switches SW3 and SW4 are in non-conductive state. That is, the low-level (=with respect to VEE2) driving signal Ga is output from the first output terminal To1, and the driving signal Gb is not output from the second output terminal To2. Therefore, during the period until time t1, the voltage value of the driving signal GH is at low level (=with respect to VEE2). From this, as described above, the period before time t1 is the OFF period Toff of the switching device SW1.

Note that, until time t1, the third timer circuit 459, receiving the high-level inverted signal S15, maintains the third timer signal S16 at low level.

When time t1 is reached, the ECU 2, while maintaining the discharge signal ACD at low level, raises the input signal INH to high level, and maintains the logic levels of the discharge signal ACD and the input signal INH until time t2 is reached.

During the period from time t1 to time t2, the logic circuit 415, receiving the high-level input signal INH and the low-level discharge signal ACD, pulse-drives the first internal signal S1 at the standard period while maintaining the second internal signal S2 at low level.

Also, during the period from time t1 to time t2, the RS flip-flop 456 receives the first internal signal S1 pulse-driving at the standard period at its set terminal (S) and the second internal signal S2 maintained at low level at its reset terminal (R). Therefore, the RS flip-flop 456 uses the pulse edge (rising edge) generated in the first internal signal S1 at time t1 as a trigger to raise the control signal S9 to high level. Then, the RS flip-flop 456 maintains the control signal S9 at high level during the period from time t1 to time t2.

Also, during the period from time t1 to time t2, the OR gate OG1 receives the first internal signal S1 pulse-driving at the standard period at its first input terminal and the second internal signal S2 maintained at low level at its second input terminal. Therefore, during the period from time t1 to time t2, the OR gate OG1 pulse-drives the monitoring signal S10 in synchronization with the first internal signal S1's pulse-driving (illustration omitted).

Also, during the period from time t1 to time t2, the first timer circuit 457 raises the first timer signal S11 from low level to high level to match the timing of the monitoring signal S10's pulses (=first internal signal S1's pulses). Then, it maintains the first timer signal S11 at high level until the first time Ta (in view of this figure, 40 ns) elapses from the timing when it raised the first timer signal S11 to high level. At the time when the first time Ta has elapsed from rising to high level, it drops the first timer signal S11 back to low level. Therefore, during the period from time t1 to time t2, the first timer signal S11 is a pulse signal having a pulse width of first time Ta.

Also, during the period from time t1 to time t2, the second timer circuit 458 receives the first timer signal S11 with a pulse width of the first time Ta, and sets the second timer signal S13 to low level. In other words, the second timer circuit 458 maintains the second timer signal S13 at low level because the duration of the first timer signal S11's high level is the first time Ta and does not reach the second time Tb (in view of this figure, 200 ns).

Also, during the period from time t1 to time t2, the RS flip-flop 461 receives the low-level second timer signal S13 at its set input terminal (S). Therefore, regardless of the logic level of the control signal S14 input to its reset input terminal (R), the RS flip-flop 461 maintains the detection signal S8 at low level. Thus, at this time the inverted signal S15 is maintained at high level (illustration omitted).

Also, during the period from time t1 to time t2, the AND gate AG1 receives the control signal S9 maintained at high level at its first input terminal and the inverted signal S15 maintained at high level at its second input terminal. Therefore, the AND gate AG1 sets the first drive control signal S4 to high level (illustration omitted).

Also, during the period from time t1 to time t2, the inverter IV1 receives the control signal S9 maintained at high level and maintains the control signal S17 at low level (illustration omitted). Therefore, the AND gate AG2 receives the control signal S17 maintained at low level at its first input terminal and the detection signal S8 maintained at low level at its second input terminal. As a result, the AND gate AG2 maintains the second drive control signal S5 at low level until time t2 is reached (illustration omitted).

Also, as described above, during the period from time t1 to time t2, the first drive control signal S4 is maintained at high level and the second drive control signal S5 is maintained at low level. As a result, until time t2 is reached, the transistor P1 is ON, the transistor N1 is OFF, and switches SW3 and SW4 are in non-conductive state. That is, the high-level (=with respect to VCC2) driving signal Ga is output from the first output terminal To1, and the driving signal Gb is not output from the second output terminal To2. Therefore, during the period from time t1 to time t2, the voltage value of the driving signal GH is at high level (=with respect to VCC2). From this, as described above, the period from time t1 to time t2 is the ON period Ton of the switching device SW1.

Note that, during the period from time t1 to time t2, the third timer circuit 459, receiving the high-level inverted signal S15, maintains the third timer signal S16 at low level.

When time t2 is reached, the ECU 2, while maintaining the input signal INH at high level, raises the discharge signal ACD to high level. Then, at time t3 that is reached after a predetermined time has elapsed from time t2, the ECU 2, while maintaining the discharge signal ACD at low level, drops the input signal INH to low level. Then, during the high impedance period ThiZ until time t6 is reached, the ECU 2 maintains the logic levels of the discharge signal ACD and the input signal INH.

During the period from time t3 until time t4*a* when the pulse stop time Td elapses, the logic circuit 415, receiving the low-level input signal INH and the high-level discharge signal ACD, maintains the first internal signal S1 at low level and pulse-drives the second internal signal S2 at the specific period. When time t4*a* is reached, the logic circuit 415, while maintaining the first internal signal S1 at low level, maintains the second internal signal S2 at low level.

During the period from time t3 to time t4*a*, the RS flip-flop 456 receives the first internal signal S1 maintained at low level at its set terminal (S) and the second internal signal S2 pulse-driving at the specific period at its reset terminal (R). Also, at time t3 the output terminal (Q) of the RS flip-flop 456 (=logic level of the control signal S9) is set to high level. Therefore, the RS flip-flop 456 uses the pulse edge (rising edge) of the second internal signal S2 at time t3 as a trigger to drop the control signal S9 to low level. Then, from time t3 onwards, the RS flip-flop 456 maintains the control signal S9 at low level until time t7 when the first internal signal S1 input to its set terminal (S) next pulse-drives.

During the period from time t3 to time t4*a*, the OR gate OG1 receives the first internal signal S1 maintained at low level at its first input terminal and the second internal signal S2 pulse-driving at the specific period at its second input terminal. Therefore, during the period from time t3 to time t4*a*, the OR gate OG1 pulse-drives the monitoring signal S10 in synchronization with the second internal signal S2's pulse-driving (illustration omitted).

When time t3 is reached, the first timer circuit 457 raises the first timer signal S11 to high level to match the timing of the monitoring signal S10's pulses (=the second internal signal S2's pulses). During the period from time t3 to time t4*a*, the second internal signal S2 is pulse-driving at the specific period shorter than first time Ta. Therefore, the next timing of the monitoring signal S10's pulses is reached before the first time Ta elapses from the timing of the monitoring signal S10's pulses. As a result, the first timer circuit 457 continues to maintain the first timer signal S11 at high level without dropping it to low level.

When time t4 is reached after the second time Tb has elapsed from time t3, the second timer circuit 458 determines that the duration of the first timer signal S11's high level has reached the second time Tb and raises the second timer signal S13 to high level. In other words, until time t4, the second timer circuit 458 maintains the second timer signal S13 at low level.

During the period from time t3 to time t4, the RS flip-flop 461 receives the low-level second timer signal S13 at its set input terminal (S). Also, during this period, the low-level third timer signal S16 is input to its reset input terminal (R). Therefore, during the period from time t3 to time t4, the RS flip-flop 461 sets the detection signal S8 to low level.

During the period from time t3 to time t4, the AND gate AG1 receives the low-level control signal S9 at its first input terminal and the low-level detection signal S8 at its second input terminal. Therefore, during the period from time t3 to time t4, the AND gate AG1 sets the first drive control signal S4 to low level.

Also, during the period from time t3 to time t4, the AND gate AG2 receives the high-level control signal S17 at its first input terminal and the low-level detection signal S8 at its second input terminal. Therefore, during the period from time t3 to time t4, the AND gate AG2 sets the second drive control signal S5 to low level.

Therefore, during the period from time t3 to time t4, the driver circuit 501 turns OFF the transistor P1 and turns ON the transistor N1 to set the driving signal Ga to low level (=with respect to VEE2). Also, during the period from time t3 to time t4, switches SW3 and SW4 are OFF and the driving signal Gb is not output from the second output terminal To2. Therefore, the driving signal GH becomes low level (=with respect to VEE2) according to the driving signal Ga.

At time t4*a* when the above-mentioned pulse stop time Td has elapsed from time t3, the logic circuit 415 (more specifically, pulse generation circuit 453) stops the pulses of the second internal signal S2 and the second internal signal S2 is maintained at low level. Then, the first timer circuit 457 drops the first timer signal S11 to low level at time t4*b* when the first time Ta has elapsed from time t4*a*. Therefore, at time t4*b*, the second timer circuit 458 drops the second timer signal S13 to low level.

When the second timer signal S13 rises to high level at time t4, the RS flip-flop 461 raises the detection signal S8 to high level. At this time, the RS flip-flop 461 also drops the inverted signal S15 to low level. When the second timer signal S13 drops to low level at time t4*b*, the low-level control signal S14 is being input to the reset input terminal (R) of the RS flip-flop 461. Therefore, at time t4*b*, the RS flip-flop 461 maintains the detection signal S8 at high level and the inverted signal S15 at low level.

When the inverted signal S15 drops to low level at time t4, the third timer circuit 459, receiving the low-level inverted signal S15, sets the third timer signal S16 to high level. When time t5 is reached after the third time Tc has elapsed from time t4, the third timer circuit 459 drops the third timer signal S16 to low level.

During the period from time t4 to time t5, the NOR gate NG1 receives the high-level third timer signal S16 at its second input terminal. Therefore, during the period from time t4 to time t5, the NOR gate NG1 maintains the control signal S14 at low level regardless of the logic level of the monitoring signal S10 input to its first input terminal. Therefore, the RS flip-flop 461, even after time t4*b*, maintains the detection signal S8 at high level while the control signal S14 is maintained at low level.

Also, during the period from time t4 to time t7, the AND gate AG2 receives the high-level control signal S17 at its first input terminal and the high-level detection signal S8 at its second input terminal. Therefore, during the period from time t4 to time t7, the AND gate AG2 sets the second drive control signal S5 to high level.

During the period from time t4 to time t7, the driver circuit 501, receiving the high-level second drive control signal S5, turns OFF both transistors P1 and N1 regardless of the logic level of the first drive control signal S4, putting the first output terminal To1 in high impedance state.

Also, during the period from time t4 to time t7, upon receiving the high-level second drive control signal S5, the second driving circuit 502 outputs the driving signal Gb from the second output terminal To2. Therefore, during the period from time t4 to time t7, the voltage value of the driving signal GH becomes equal to the voltage value of the driving signal Gb.

When time t6 is reached after a predetermined time has elapsed from time t5, the ECU 2 drops the discharge signal ACD to low level. Then, when time t7 is reached, the ECU 2, while maintaining the discharge signal ACD at low level, raises the input signal INH to high level. Then, from time t7 onwards until an unillustrated predetermined time, the ECU 2 maintains the input signal INH at high level and the discharge signal ACD at low level.

When the input signal INH rises to high level at time t7, the logic circuit 415, receiving the high-level input signal INH and the low-level discharge signal ACD, pulse-drives the first internal signal S1 at the standard period while maintaining the second internal signal S2 at low level. That is, the states of the first internal signal S1 and the second internal signal S2 become the same as during the period from time t1 to time t2.

Therefore, from time t7 onwards, each signal is controlled in the same way as during the period from time t1 to time t2. Specifically, it operates as follows.

From time t7 onwards, the control signal S9 is maintained at high level, and the monitoring signal S10 pulse-drives in synchronization with the first internal signal S1's pulse-driving. Also, the first timer signal S11 pulse-drives with a pulse width of first time Ta. Also, the second timer signal S13 is maintained at low level, the detection signal S8 is maintained at low level, and the inverted signal S15 is maintained at high level. As a result, the first drive control signal S4 is maintained at high level and the second drive control signal S5 is maintained at low level.

Therefore, from time t7 onwards, like during the period from time t1 to time t2, the voltage value of the driving signal GH becomes high level (=VCC2 level) and this becomes the ON period Ton of the switching device SW1.

Also, when time t7 is reached, the detection signal S8 drops to low level and the inverted signal S15 rises to high level. In response to this, the AND gate AG1 sets the first drive control signal S4 to high level and AND gate 2 sets the second drive control signal S5 to low level. Therefore, when time t7 is reached, the driver circuit 501 turns ON the transistor P1 and turns OFF the transistor N1 to set the driving signal Ga to high level (=with respect to VCC2). Also, switches SW3 and SW4 turn OFF and the driving signal Gb stops being output from the second output terminal To2. Therefore, when time t7 is reached, the voltage value of the driving signal GH rises from the voltage value of the driving signal Gb to high level (=with respect to VCC2).

<Discharge Function>

Figure 15:
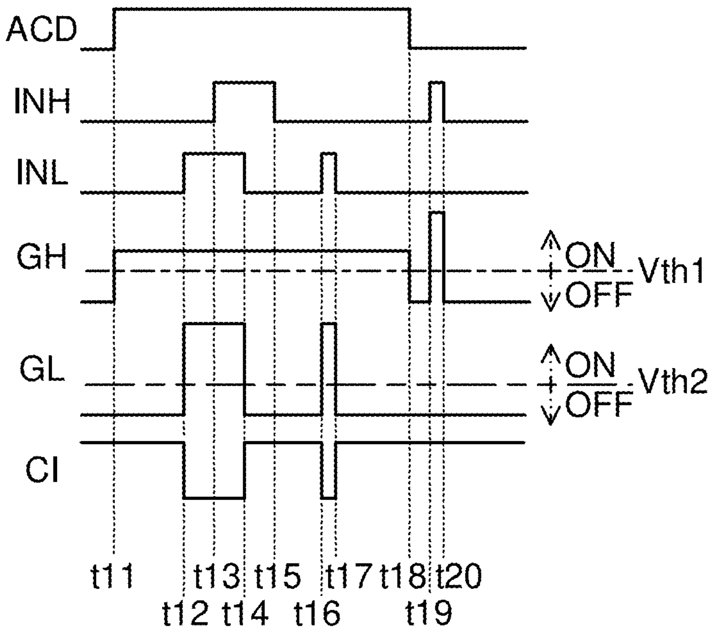
FIG. 15 is a timing chart showing the control timing of the discharge function in this configuration example.

Next, the discharge function in case of using the signal transmission device 200X described earlier as signal transmission devices 200H and 200L shown in FIG. 10 will be explained. FIG. 15 is a timing chart showing the control timing of the discharge function in this configuration example. From top to bottom, it shows the discharge signal ACD, input signals INH and INL, driving signals GH and GL, and current CI (=the current value flowing from the capacitor C1). Note that, here, the interpretation and explanation will be made with the signal transmission devices 200H and 200L shown in FIG. 10 as being replaced with the signal transmission device 200X described earlier.

As shown in FIG. 15, at a predetermined time t11, the discharge signal ACD rises from low level to high level. Then, the driving signal GH rises from low level to the same voltage value as the driving signal Gb. This causes the switching device SW1 to enter ON state. However, during the period from time t11 to time t12, the input signal INL is maintained at low level and the switching device SW2 is OFF. Therefore, the current CI does not flow from the capacitor C1. That is, the charge amount in the capacitor C1 does not decrease.

When time t12 is reached, the input signal INL rises to high level. This causes the switching device SW2 to turn ON. As a result, the current CI begins to flow from the capacitor C1 and charge begins to be drawn from the capacitor C1. When time t13 is reached, the input signal INH rises to high level, but as described above, during execution of the discharge function the first driving circuit 501 is in invalid state and the voltage value of the driving signal GH is maintained at the voltage value of the driving signal Gb.

When time t14 is reached, the input signal INL drops from high level to low level. This causes switch SW2 to turn OFF. As a result, the current CI stops flowing from the capacitor C1 and charge stops being drawn from the capacitor C1.

When time t16 is reached after a predetermined time has elapsed from time t14, the input signal INL rises to high level again. At this time, the discharge signal ACD is maintained at high level and the driving signal GH is maintained at the voltage value of the driving signal Gb. That is, the switching device SW1 is ON. Therefore, when the switching device SW2 turns ON, the current CI flows from the capacitor C1 and charge begins to be drawn from the capacitor C1.

When time t17 is reached, the input signal INL drops to low level again. This causes the switching device SW1 to turn OFF. As a result, the current CI stops flowing from the capacitor C1 and charge stops being drawn from the capacitor C1.

When time t18 is reached after a predetermined time has elapsed from time t17, the discharge signal ACD drops from high level to low level. This causes the driving signal GH to drop to low level (=VEE2 level) and the switching device SW1 turns OFF.

After time t18, the discharge function described above is terminated and normal output control is performed. That is, when time t19 is reached after a predetermined time has elapsed from time t18, the input signal INH rises to high level (=VCC2 level) again. This causes the switching device SW1 to fully turn ON. Then, when time t19 is reached, the input signal INH is dropped back to low level (=VEE2 level) and the switching device SW1 turns OFF.

Here, as described above, the voltage value of the driving signal Gb is higher than the ON threshold voltage Vth1 of the switching device SW1 and lower than the high-level (=VCC2) driving signal Ga. That is, during the period from time t11 to time t18, the switching device SW1 has lower conductance than in fully ON state (saturation state). Therefore, the current value of the current CI flowing during the period from time t12 to time t14 and the period from time t16 to time t17 is lower than the current value of the current CI that would flow if both the switching device SW1 and the switching device SW2 were fully ON (saturation state). Therefore, it is possible to suppress overcurrent from flowing through the switching devices SW1 and SW2 and the capacitor C1, and to suppress the switching devices SW1 and SW2 and the capacitor C1 from being destroyed by overcurrent.

Also, as described above, charge can be drawn from the capacitor C1 by fully turning ON the switching device SW2 while the switching device SW1 is ON with the driving signal GH at the same level as the driving signal Gb. Therefore, by keeping the switching device SW1 in an ON state with the driving signal GH at the same level as the driving signal Gb for a relatively long period, during this period the capacitor C1 can have the desired amount of charge drawn from it just by turning ON the switching device SW2 normally. Therefore, the timing adjustment of ON/OFF control of the switching devices SW1 and SW2 becomes relatively easy, and an increase in manufacturing cost of the signal transmission device 200 can be suppressed.

Also, as described above, as a signal for executing the discharge function, either the first internal signal S1 or the second internal signal S2 is pulse-driven at the specific period to transmit a signal from the first semiconductor chip 410 to the second semiconductor chip 420. That is, it becomes possible to transmit a signal for executing the discharge function from the first semiconductor chip 410 to the second semiconductor chip 420 through the transmission path for normal driving signals (the first internal signal S1 and the second internal signal S2) for the switching devices SW1 and SW2. Therefore, there is no need to provide a separate path for transmitting signals to execute the discharge function. As a result, increases in circuit area and manufacturing cost of the signal transmission device 200 can be suppressed.

Modified Embodiment

Figure 18:
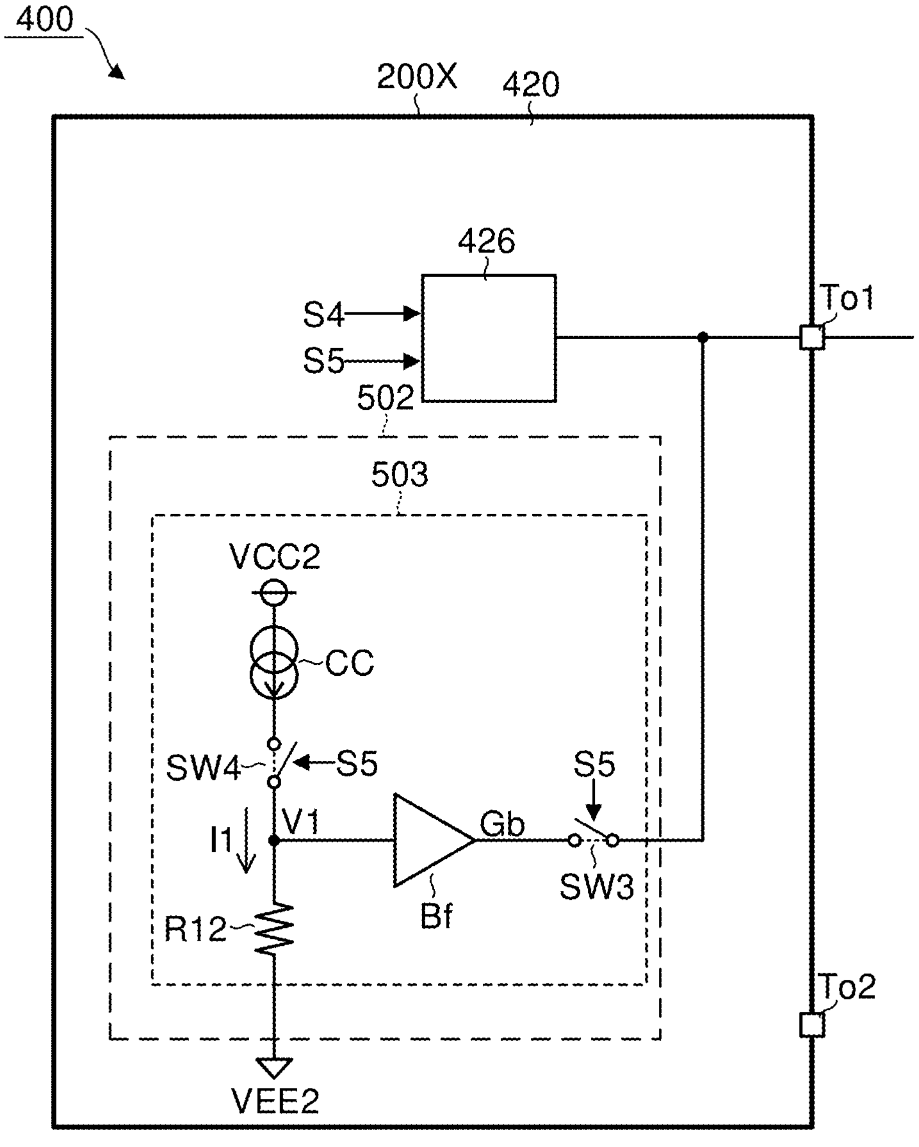
FIG. 18 is a diagram showing a modified embodiment of the signal transmission device of the present disclosure.

The present disclosure is not limited to the above embodiments and various changes can be made without departing from the spirit of the present disclosure. For example, in the above embodiment, the second driving circuit 502 was described as being connected to the second output terminal To2, but this is not limiting. For example, as shown in FIG. 18, it could be configured to be connected to the first output terminal To1 inside the second semiconductor chip 420.

With such a configuration, the second driving circuit 502 would input the driving signal Gb to the gate terminal of the switching device SW1 via the first output terminal To1. Therefore, the second output terminal To2 can be used for other purposes (for example, using for functions like outputting soft turn-off signals, etc.).

Also, in the above embodiment, the switching devices SW1 and SW2 were described as being IGBTs, but these could be replaced with power MOSFETs, SiC-MOSFETs [Silicon Carbide-Metal Oxide Semiconductor FET], SiC-SITs [SiC-Static Induction Transistor], or GaN-MOSFETs [Gallium Nitride-MOSFET] or other power semiconductor devices capable of high-frequency operation.

<Implementation Example of Signal Transmission Device 200X of the Present Disclosure>

Figure 16:
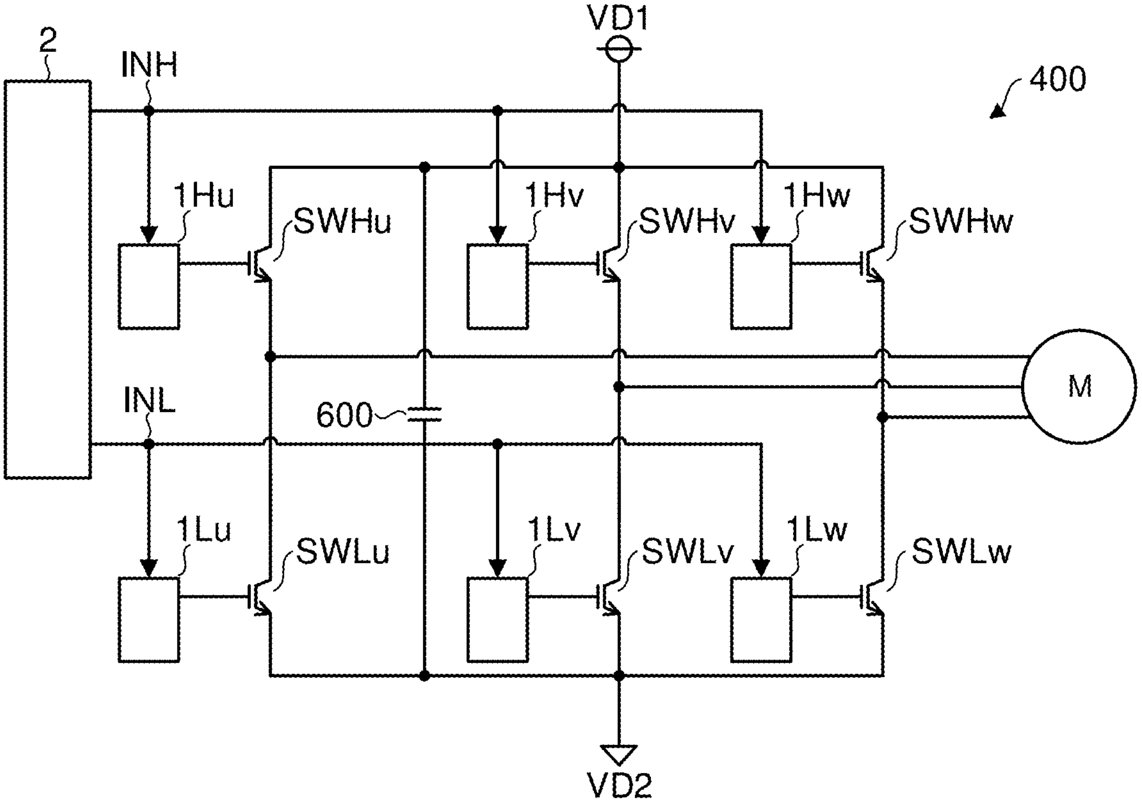
FIG. 16 is a block diagram showing an implementation example of the signal transmission device of the present disclosure.
Figure 17:
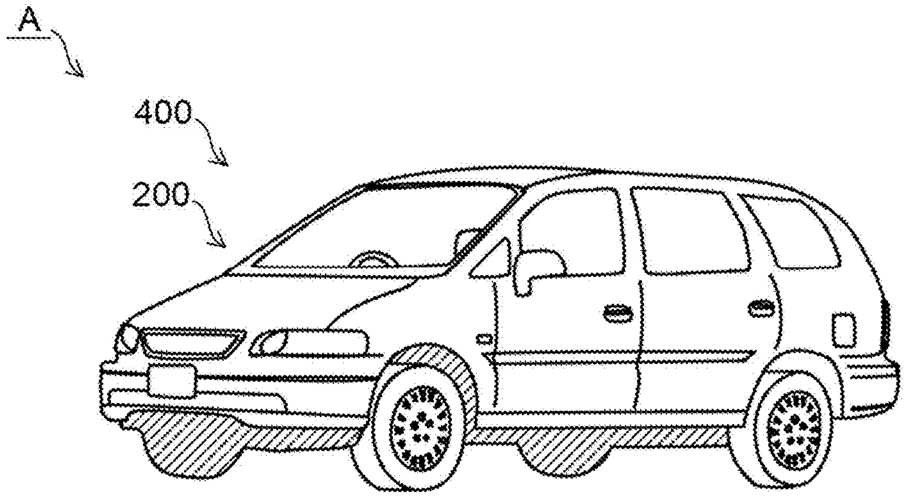
FIG. 17 is a diagram showing a vehicle incorporating the electronic device.

FIG. 16 is a block diagram showing an implementation example of the signal transmission device 200X of the present disclosure. FIG. 17 shows a vehicle A equipped with the electronic device 400. The electronic device 400 equipped with the signal transmission device 200X of the present disclosure can be suitably used in the vehicle A (see FIG. 17) that is either an engine vehicle or electric vehicle. The electronic device 400 can be suitably used as a motor driving device that performs drive control of the motor M mounted in the vehicle A.

As shown in FIG. 16, the motor M is a three-phase motor that is rotationally driven according to three-phase driving voltages U/V/W input respectively from three-phase (U-phase/V-phase/W-phase) half-bridge output stages.

The electronic device 400 has three isolated gate drivers 1H (u/v/w), three isolated gate drivers 1L (u/v/w), three high-side switching devices SWH (u/v/w), three low-side switching devices SWL (u/v/w), an ECU 2, and a capacitor C1.

The isolated gate drivers 1H (u/v/w) each drive corresponding high-side switching devices SWH (u/v/w) by generating an upper gate driving signal (corresponding to the driving signal GH described earlier) according to an upper gate control signal INH (corresponding to the input signal INH described earlier) input from the ECU 2, while isolating between the ECU 2 and high-side switching devices SWH (u/v/w).

The isolated gate drivers 1L (u/v/w) each drive corresponding low-side switching devices SWL (u/v/w) by generating a lower gate driving signal (corresponding to the driving signal GH described earlier) according to a lower gate control signal INL (corresponding to the input signal INL described earlier) input from the ECU 2, while isolating between the ECU 2 and low-side switching devices SWL (u/v/w).

The high-side switching devices SWH (u/v/w) are each gate-driven by corresponding isolated gate drivers 1H (u/v/w) respectively. Also, high-side switching devices SWH (u/v/w) are each connected between the power system power supply terminal (=the application terminal of the first motor driving voltage VD1) and each phase input terminal of the motor M.

The low-side switching devices SWL (u/v/w) are each gate-driven by corresponding isolated gate drivers 1L (u/v/w) respectively. Also, low-side switching devices SWL (u/v/w) are each connected between each phase input terminal of the motor M and the power system ground terminal (=the application terminal of the second motor driving voltage VD2).

Note that, in this figure, IGBTs are used as high-side switching devices SWH (u/v/w) and low-side switching devices SWL (u/v/w), but as mentioned earlier, SiC-MOSFETs or Si-MOSFETs can be used instead of IGBTs.

The ECU 2 controls the rotational drive of the motor M by driving high-side switching devices SWH (u/v/w) and low-side switching devices SWL (u/v/w) respectively via isolated gate drivers 1H (u/v/w) and 1L (u/v/w). Also, the ECU 2 has functionality to perform various safety controls by monitoring FLT1 terminals and FLT2 terminals of each of isolated gate drivers 1H (u/v/w) and 1L (u/v/w).

A capacitor C1 (corresponding to the capacitor C1 described earlier) is provided for smoothing the voltage between the application terminals of the first motor driving voltage VD1 and the second motor driving voltage VD2. The capacitor C1 stabilizes the DC voltage (=voltage between application terminals of the first motor driving voltage VD1 and the second motor driving voltage VD2) that varies according to variations in power consumption of the motor M.

Here, the signal transmission device 200X described earlier can be suitably used as each of isolated gate drivers 1H (u/v/w) and 1L (u/v/w). For example, an isolated gate driver 1H and an isolated gate driver 1L for one phase of the three phases (in view of this figure, for example, U-phase) can be the signal transmission device 200X.

Note that, when using the signal transmission device 200X described earlier as isolated gate drivers 1H (u/v/w), the switch SW1 in FIG. 10 becomes high-side switches SWH (u/v/w) in FIG. 16. In this case, node n1 shown in FIGS. 10 and 11 can be considered as the application terminal of the first motor driving voltage VD1 in FIG. 16. Also, node n2 shown in FIGS. 10 and 12 can be considered as the connection terminal to the motor M in FIG. 16.

Also, when using the signal transmission device 200X as isolated gate drivers 1L (u/v/w), the switch device SW1 in FIG. 11 becomes low-side switches SWL (u/v/w) in FIG. 16. In this case, node n1 shown in FIG. 11 can be considered as the connection terminal to the motor M in FIG. 16. Also, node n2 shown in FIG. 11 can be considered as the application terminal of the second motor driving voltage VD2 in FIG. 16. Also, in this case, what was referred to as the input signal INH in FIG. 11 and corresponding explanations above can be interpreted as the input signal INL.

APPENDIX

The signal transmission device (200X) described in the present specification has a configuration comprising: a transmission circuit (410) configured to output a first internal signal (S1) and a second internal signal (S2) which pulse-drive according to an input signal (INH, INL); a reception circuit (420) configured to output a drive control signal (Ga) according to the first internal signal (S1) and the second internal signal (S2); and an isolation circuit (430) configured to transmit the first internal signal (S1) and the second internal signal (S2) while isolating between the transmission circuit (410) and the reception circuit (420), where the transmission circuit (410) is configured to drive at least one of the first internal signal (S1) and the second internal signal (S2) at a specific period different from a period of the input signal (INH, INL) according to an external signal (ACD) different from the input signal (INH, INL), where reception circuit (420) includes: a detection circuit (455) configured to be able to detect that a period of at least one of the first internal signal (S1) and the second internal signal (S2) is the specific period; a first driving circuit (426) configured to drive a switching device (SW1) with the drive control signal (Ga) and to set a gate of the switching device (SW1) to high impedance state according to a detection result of the detection circuit (455); and a second driving circuit (502) configured to turn ON the switching device (SW1) by inputting a specific voltage (Gb) to the gate according to the detection result, where the specific voltage (Gb) has a voltage value higher than or equal to an ON threshold voltage of the switching device (SW1). (A first configuration.)

The signal transmission device (200X) according to the first configuration preferably has a configuration where: the second driving circuit (502) includes: a voltage generation circuit (503) configured to generate the specific voltage (Gb); and a switching circuit (SW3, SW4) connected between an application terminal of the specific voltage (Gb) and the gate, and configured to put the application terminal and the gate in conductive/non-conductive state according to the detection result of the detection circuit (455). (A second configuration.)

The signal transmission device (200X) according to the first or second configurations preferably has a configuration where: the transmission circuit (410) is configured to, when the external signal (ACD) is at first logic level, pulse-drive the first internal signal (S1) and the second internal signal (S2) between third logic level and fourth logic level according to the input signal (INH, INL), and when the external signal (ACD) is at second logic level, maintain one of the first internal signal (S1) and the second internal signal (S2) at the third logic level while pulse-driving the other at the specific period, and the detection circuit (455) includes: a timer circuit (458) configured to be able to detect when a duration of the second internal signal (S2) pulse-driving at the specific period reaches a first period (Tb); and a mask circuit (NG1) configured to mask the second internal signal (S2) to prevent the switching device (SW1) from being driven according to the second internal signal (S2)'s pulse-driving during the period from when the duration reaches the first period (Tb) until the second period (Td) elapses. (A third configuration.)

The signal transmission device (200X) according to any of the first to third configurations preferably has a configuration where: the first driving circuit (426) is configured to pulse-drive the drive control signal (Ga) between fifth logic level with a voltage value lower than the ON threshold voltage and sixth logic level with a voltage value higher than the ON threshold voltage, and the specific voltage (Gb) has a voltage value lower than the sixth logic level. (A fourth configuration)

The signal transmission device (200X) according to any of the first to fourth configurations preferably has a configuration having: a first chip (410) having circuit elements of the transmission circuit (410) integrated; a second chip (420) having circuit elements of the reception circuit (420) integrated; and a third chip (430) having circuit elements of the isolation circuit (430) integrated, where these are sealed in a single package. (A fifth configuration.)

The signal transmission device (200X) according to the fifth configuration preferably has a configuration where: the second chip (420) includes a first terminal (To1) electrically connected to the gate; and the first driving circuit (426) and the second driving circuit (502) are configured to input signals to the gate via the first terminal (To1). (A sixth configuration.)

The signal transmission device (200X) according to the fifth configuration preferably has a configuration where: the second chip (420) includes a first terminal (To1) and the second terminal (To2) electrically connected to the gate, the first driving circuit (426) is configured to input signals to the gate via the first terminal (To1), and the second driving circuit (502) is configured to input signals to the gate via the second terminal (To2). (A seventh configuration.)

The electronic device (400) described in the specification preferably has an configuration including: a plurality of switching devices (SW1) each being a power transistor; and a plurality of gate driver ICs each driving the gate of corresponding one of the plurality of switching devices (SW1), where at least one of the plurality of gate driver ICs is the signal transmission device (200X) according to any of the first to fourth configurations. (An eighth configuration.)

The vehicle (A) described in the specification preferably has a configuration including the electronic device (400) according to the eighth configuration. (A nineth configuration.)

The invention claimed is:

1. A signal transmission device comprising:

a transmission circuit configured to output a first internal signal and a second internal signal which drive according to an input signal;

a reception circuit configured to output a drive control signal according to the first internal signal and the second internal signal; and an isolation circuit configured to transmit the first internal signal and the second internal signal while isolating between the transmission circuit and the reception circuit, wherein:

the transmission circuit is configured to pulse-drive at least one of the first internal signal and the second internal signal at a specific period different from a period of the input signal according to an external signal different from the input signal, the reception circuit includes:

a detection circuit configured to be able to detect that a period of at least one of the first internal signal and the second internal signal is the specific period;

a first driving circuit configured to drive a switching device with the drive control signal and to set a gate of the switching device to high impedance state according to a detection result of the detection circuit; and a second driving circuit configured to turn ON the switching device by inputting a specific voltage to the gate according to the detection result, wherein the specific voltage has a voltage value higher than or equal to an ON threshold voltage of the switching device.

2. The signal transmission device according to claim 1, wherein:

the second driving circuit includes:

a voltage generation circuit configured to generate the specific voltage; and a switching circuit connected between an application terminal of the specific voltage and the gate, and configured to put the application terminal and the gate in conductive/non-conductive state according to the detection result of the detection circuit.

3. The signal transmission device according to claim 1, wherein:

the transmission circuit is configured to:

when the external signal is at first logic level, pulse-drive the first internal signal and the second internal signal between third logic level and fourth logic level according to the input signal; and when the external signal is at second logic level, maintain one of the first internal signal and the second internal signal at the third logic level while pulse-driving the other at the specific period, and the detection circuit includes:

a timer circuit configured to be able to detect when a duration of the second internal signal pulse-driving at the specific period reaches a first period; and a mask circuit configured to mask the second internal signal to prevent the switching device from being driven according to the second internal signal's pulse-driving during the period from when the duration reaches the first period until a second period elapses.

4. The signal transmission device according to claim 1, wherein:

the first driving circuit is configured to pulse-drive the drive control signal between fifth logic level with a voltage value lower than the ON threshold voltage and sixth logic level with a voltage value higher than the ON threshold voltage, and the specific voltage has a voltage value lower than the sixth logic level.

5. The signal transmission device according to claim 1, comprising:

a first chip having circuit elements of the transmission circuit integrated;

a second chip having circuit elements of the reception circuit integrated; and a third chip having circuit elements of the isolation circuit integrated, wherein these are sealed in a single package.

6. The signal transmission device according to claim 5, wherein:

the second chip includes a first terminal electrically connected to the gate, and the first driving circuit and the second driving circuit are configured to input signals to the gate via the first terminal.

7. The signal transmission device according to claim 5, wherein:

the second chip includes a first terminal and a second terminal electrically connected to the gate, the first driving circuit is configured to input signals to the gate via the first terminal, and the second driving circuit is configured to input signals to the gate via the second terminal.

8. An electronic device comprising:

a plurality of switching devices each being a power transistor; and a plurality of gate driver ICs each driving the gate of corresponding one of the plurality of the switching devices, wherein at least one of the plurality of gate driver ICs is the signal transmission device according to claim 1.

9. A vehicle comprising the electronic device according to claim 8.

* * * * *